(12) United States Patent
Chen et al.

(10) Patent No.: US 6,200,726 B1
(45) Date of Patent: Mar. 13, 2001

(54) OPTIMIZATION OF SPACE WIDTH FOR HYBRID PHOTORESIST

(75) Inventors: Kuang-Jung Chen, Poughkeepsie, NY (US); Steven J. Holmes, Milton, VT (US); Wu-Song Huang; Ahmad D. Katnani, both of Poughkeepsie, NY (US); Paul A. Rabidoux, Winooski, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/170,756

(22) Filed: Oct. 13, 1998

Related U.S. Application Data

(63) Continuation-in-part of application No. 08/715,287, filed on Sep. 16, 1996, now Pat. No. 6,114,082.

(51) Int. Cl.$^7$ .............................. G03C 1/73; G03C 5/56; G03F 7/30
(52) U.S. Cl. ................. 430/270.1; 430/914; 430/905; 430/927; 430/322; 430/325; 430/326
(58) Field of Search ............................. 430/270.1, 914, 430/905, 921, 924, 925, 927, 322, 325, 326, 191, 192

(56) References Cited

U.S. PATENT DOCUMENTS

| | | | |
|---|---|---|---|
| 5,070,001 | * 12/1991 | Stahlhofen | 430/281.1 |
| 5,272,042 | 12/1993 | Allen et al. | 430/270.1 |
| 5,322,765 | 6/1994 | Clecak et al. | 430/326 |
| 5,403,695 | * 4/1995 | Hayase et al. | 430/192 |
| 5,496,678 | 3/1996 | Imai et al. | 430/176 |
| 5,550,004 | 8/1996 | Honda | 430/270.1 |
| 5,558,976 | 9/1996 | Urano et al. | 430/326 |
| 5,585,507 | 12/1996 | Nakano et al. | 556/7 |
| 5,633,112 | 5/1997 | Miwa et al. | 430/176 |
| 5,667,938 | 9/1997 | Bantu et al. | 430/270.1 |
| 5,670,299 | 9/1997 | Urano et al. | 430/326 |
| 5,691,100 | 11/1997 | Kudo et al. | 430/170 |
| 5,962,184 | * 10/1999 | Allen et al. | 430/270.1 |

OTHER PUBLICATIONS

"Terpenoids", Encyclopedia of Chemical Technology, vol. 23, 4th Edition, pp 833–835.
Decennial Index to Chemical Abstracts, vols. 21–30, Subject Index A–D, 1927–1936, pp 3956–3957.

* cited by examiner

*Primary Examiner*—Janet Baxter
*Assistant Examiner*—Sin J. Lee
(74) *Attorney, Agent, or Firm*—Schmeiser, Olsen & Watts; William D. Sabo

(57) ABSTRACT

A photo resist composition contains at least one photoacid generator (PAG), wherein at least two photoacids are produced upon exposure of the photo resist to actinic energy and wherein the photo resist is capable of producing a hybrid response. The function of providing generation of two photoacids in a hybrid resist is to optimize the use of hybrid resist by varying the hybrid space width. The at least two photoacids may differ in their effectiveness at catalyzing at least one mechanism of the hybrid response. In particular, one photoacid may be a weaker acid and another may be a stronger acid, wherein there exists a difference of at least four orders of magnitude between the acid dissociation constant ($K_a$) of the weaker acid and the stronger acid. A method for optimizing space width in a hybrid photo resist includes the steps of: 1) selecting a desired space width; 2) selecting at least one photoacid generator (PAG), wherein at least two photoacids will be produced upon exposure to actinic energy in relative proportions sufficient to produce the desired space width in the hybrid photo resist; and 3) forming a hybrid photo resist composition comprising the at least one PAG. The step of selecting at least one PAG may include first determining the space width produced alone by each photoacid in a group of candidate photoacids and then selecting the photoacids and corresponding at least one PAG that will produce the desired space width.

19 Claims, 18 Drawing Sheets

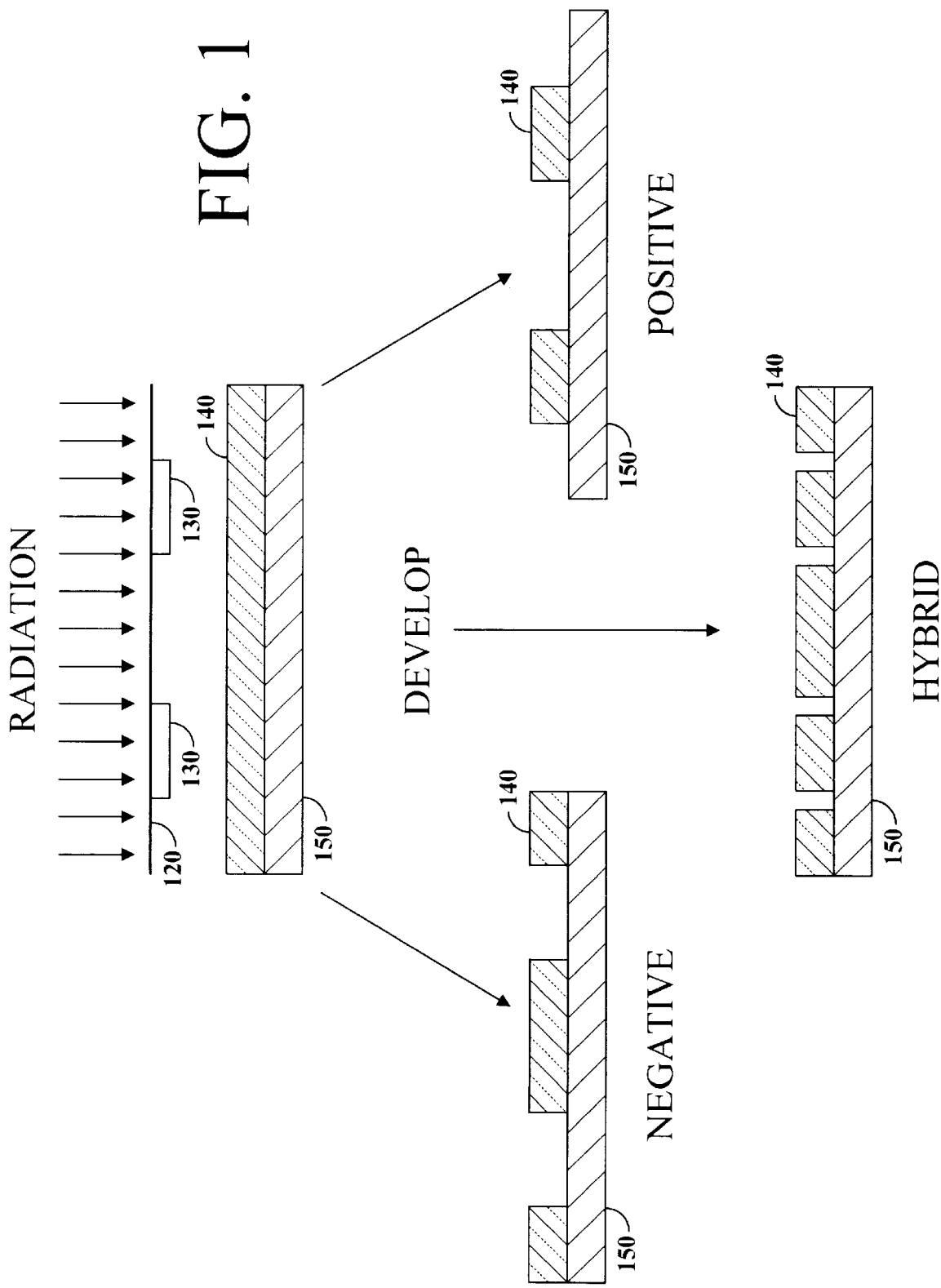

OPTIMIZATION OF SPACE WIDTH FOR HYBRID PHOTORESIST

RELATED APPLICATIONS

This application is a continuation-in-part of the earlier patent application by Hakey et al. entitled "FREQUENCY DOUBLING HYBRID PHOTORESIST HAVING NEGATIVE AND POSITIVE TONE COMPONENTS AND METHOD OF PREPARING THE SAME", Ser. No. 08/715,287, filed Sep. 16, 1996, U.S. Pat. No. 6,114,082, which is incorporated herein by reference. This application is related to the following U.S. patent applications: "LOW 'K' FACTOR HYBRID PHOTORESIST," Ser. No. 08/715,288, filed Sep. 16, 1996, "METHOD OF PHOTOLITHOGRAPHICALLY DEFINING THREE REGIONS WITH ONE MASK STEP AND SELF-ALIGNED ISOLATION STRUCTURE FORMED THEREBY," Ser. No. 08/895,748, filed Jul. 17, 1997, "METHOD FOR FORMING SIDEWALL SPACERS USING FREQUENCY DOUBLING HYBRID RESIST AND DEVICE FORMED THEREBY," Ser. No. 08/895,749, filed Jul. 17, 1997, and "NOVEL METHOD FOR VARYING X-RAY HYBRID RESIST SPACE DIMENSION," Ser. No. 09/082,886, filed May 21, 1998, each of which is incorporated herein by reference.

BACKGROUND OF THE INVENTION

1. Technical Field

This invention relates generally to the field of semiconductor manufacturing and, more specifically, to optimization of the width of spaces formed in a layer of hybrid resist during lithographic processing.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced. For the past 20 years, optical lithography has driven the device density and the industry has resorted to optical enhancements to allow increasing densities. As an example, some such enhancements include overexposing/overdeveloping, hard and soft phase shifts, phase edge masks, and edge shadowing. Unfortunately, such enhancements tend to offer only minor increases in density and the limit of optical enhancements appears inevitable in the near future.

Conventional positive and negative tone photoresists used in optical lithography are characterized by a dissolution curve in which there is a single transition from a first dissolution rate to a second dissolution rate as the resist is exposed to varying levels of actinic radiation. In a positive resist, the initially unexposed resist is practically insoluble in developer, while the exposed resist becomes more soluble as the exposure dose is increased above a threshold value. For a negative resist, similar behavior is observed, except that the initially unexposed resist is soluble in developer, and the exposed area is rendered practically insoluble. Because of this differential solubility between the exposed and unexposed resist areas, it is possible to form a pattern in the resist film. Essentially, the soluble areas of the resist dissolve in developer to become spaces in the resist, while the insoluble areas remain as lines of resist material. The pattern thus formed can be used to fabricate integrated circuit devices, and is currently a critical component in their manufacture.

In an ideal situation, the exposure tool would only allow the radiation to expose the resist material through the reticle of the mask, thus providing sharp edges for the lines and spaces. However, diffraction patterns are formed at the edges of the reticle, resulting in partial exposure of the resist about the edges of the reticle. The partial exposure yields a resist profile that exhibits some slope at the transition from a line to a space rather than a sharp, vertical profile at the edge of a line, as would be present in an ideal resist image. Contrast is one indication of the degree to which the profile of a resist image conforms to the ideal resist image. When contrast is high, typically the resist image will possess a more vertical profile. As contrast decreases, the profile exhibits more of a slope at the edge of a line and less conformity to the ideal resist image. Diffraction thus contributes to insufficient contrast since it produces sloped line edges. Limitations in producing high contrast also limit the ability to produce lines and spaces having a small width. As the desired line or space width is decreased, reticle size is typically decreased to produce the smaller dimensions. Diffraction effects are more pronounced with a smaller reticle partly because the resist lines are correspondingly smaller and the sloped line edges become a more significant effect on the resist profile. Thus, it can be said that unless contrast is sufficiently high, a typical resist will not produce small width lines and spaces with sufficiently sharp line edges.

Efforts are being made to improve the contrast of photoresists, however, the basic mechanism of operation of the photoresist continues to be the same, that is, the resists behave as either positive or negative tone systems. It is desirable, therefore, to devise new mechanisms of resist response such that conventional optical lithography can be extended to smaller feature sizes at sufficiently high contrast. It is also desirable to form high contrast, smaller feature sizes without having to develop new tools and reticles to enable the reduction in size. If new tools and reticles happened to be developed later, then any new mechanisms of resist response combined with new tools and reticles will further extend lithographic capability.

Presently, for high performance devices, the control of the image size on the reticle and the control of image size from one batch of wafers to the next comprise the largest contributors to image size variation on the product. Such variation often introduces defects into a chip, lowering the yield of acceptable chips from a given manufacturing process. Chip yield at high performance is also strongly dependent on the uniformity of the image pattern across the chip and the centering of the image pattern at the correct dimension. Uniformity across the chip is typically quantified as the "across chip line width variation" or ACLV. The above circumstances exist currently for all types of lithographic patterning which use a reticle, including: optical, x-ray, and proximity E-beam, for example. The problem of image uniformity across the reticle is especially acute for lithographic techniques that use 1× masks, such as x-ray and proximity E-beam lithography. It is therefore desired to provide a photoresist material that allows very precise resist image control for the image size, independent of the image size control on the reticle.

Therefore, there existed a need to provide increased device density and a low ACLV, wherein the resist image control is preferably independent of the reticle image size control.

DISCLOSURE OF INVENTION

According to the present invention, a photo resist composition is provided containing at least one photoacid generator (PAG), wherein at least two photoacids are produced upon exposure of the photo resist to actinic energy and wherein the photo resist is capable of producing a hybrid response. By way of example, the at least two photoacids may differ in their effectiveness at catalyzing at least one mechanism of the hybrid response. In particular, at least one of the at least two photoacids may be a weaker acid and at least one of the at least two photoacids may be a stronger acid, wherein there exists a difference of at least four orders of magnitude between the acid dissociation constant ($K_a$) of the weaker acid and the stronger acid. Further, the at least one PAG may include two PAGs, triphenylsulfonium triflate and di(p-t-butylphenyl)iodonium camphorsulfonate, respectively producing triflic acid and camphorsulfonic acid.

According to the present invention, a method for optimizing space width in a hybrid photo resist is also provided which includes the steps of: 1) selecting a desired space width; 2) selecting at least one photoacid generator (PAG), wherein at least two photoacids will be produced upon exposure to actinic energy in relative proportions sufficient to produce the desired space width in the hybrid photo resist; and 3) forming a hybrid photo resist composition comprising the at least one PAG. By way of example, the step of selecting at least one PAG may include the following steps: a) determining the space width produced alone by each photoacid in a group of candidate photoacids; b) selecting at least two photoacids from the group of candidate photoacids such that at least one photoacid produces alone a space width greater than the desired space width and at least one other photoacid produces alone a space width less than the desired space width; c) determining the relative proportions of the at least two photoacids that will produce the desired space width; and d) determining at least one PAG that will produce the at least two photoacids in the relative proportions.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements, and:

FIG. 1 is a schematic diagram showing the use of the hybrid resist;

BEST MODE FOR CARRYING OUT THE INVENTION

Figure 3:
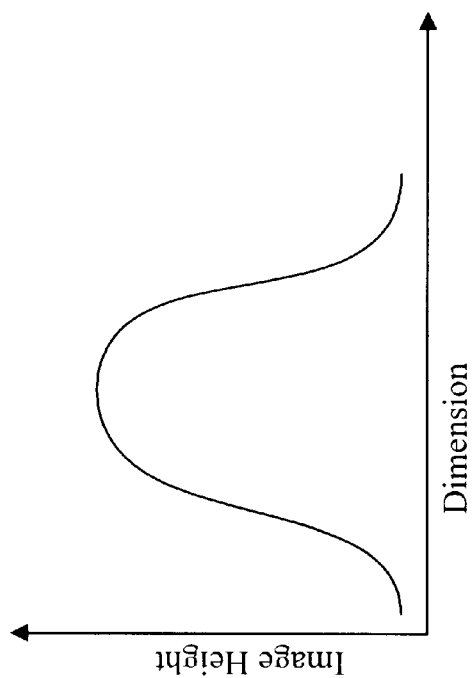
FIG. 3 is a graph illustrating the line pattern for positive resist printed with a reticle line pattern.

According to a preferred embodiment of the present invention, a photo resist composition is provided containing at least one photoacid generator (PAG), wherein at least two photoacids are produced upon exposure of the photo resist to actinic energy and wherein the photo resist is capable of producing a hybrid response. The function of providing generation of two photoacids in a hybrid resist is to optimize the use of hybrid resist. In particular, the invention provides a hybrid resist composition for which the space width may be varied. Preferably, the at least two photoacids may differ in their effectiveness at catalyzing at least one mechanism of the hybrid response. The difference in effectiveness may be sufficient such that the combined photoacids produce a space width different from the space width produced by either photoacid when used alone in a hybrid resist. More preferably, at least one of the at least two photoacids may be a weaker acid and at least one of the at least two photoacids may be a stronger acid, wherein there exists a difference of at least four orders of magnitude between the acid dissociation constant ($K_a$) of the weaker acid and the stronger acid. Further, the at least one PAG may include two PAGs, triphenylsulfonium triflate and di(p-t-butylphenyl)iodonium camphorsulfonate, respectively producing triflic acid and camphorsulfonic acid.

According to the present invention, a method for optimizing space width in a hybrid photo resist is also provided which includes the steps of: 1) selecting a desired space width; 2) selecting at least one photoacid generator (PAG), wherein at least two photoacids will be produced upon exposure to actinic energy in relative proportions sufficient to produce the desired space width in the hybrid photo resist; and 3) forming a hybrid photo resist composition comprising the at least one PAG. Preferably, the step of selecting at least one PAG may include the following steps: 1) determining the space width produced alone by each photoacid in a group of candidate photoacids; 2) selecting at least two photoacids from the group of candidate photoacids such that at least one photoacid produces alone a space width greater than the desired space width and at least one other photoacid produces alone a space width less than the desired space width; 3) determining the relative proportions of the at least two photoacids that will produce the desired space width; and 4) determining at least one PAG that will produce the at least two photoacids in the relative proportions. A description of hybrid resist will now be given, followed by a description of the preferred embodiments.

Hybrid Photoresist

The preferred embodiment uses photoresist material having, simultaneously, both a positive tone and a negative tone response to exposure. This combination of materials can provide a new type of resist, which we call a hybrid resist.

As a hybrid resist is exposed with actinic radiation, areas exposed with high intensity radiation form a negative tone line pattern. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during develop. This resist response is an expression of the unique dissolution rate properties of this resist, in which unexposed resist does not develop, partially exposed resist develops at a high rate, and highly exposed resist does not develop.

The unique dissolution rate response of the hybrid photoresist allows a single aerial image to be printed as a space/line/space combination rather than as a single line or space, as with conventional resist. This "frequency doubling" capability of this resist allows conventional expose systems to be extended to higher pattern densities. It is an advantage of one example of hybrid resist that lines and spaces of 0.2 micrometer ($\mu$m) and less can be printed with current deep ultra violet (DUV) lithography tools that are designed for operation at 0.35 $\mu$m resolution.

It is a further advantage of this type of hybrid resist that the space width is generally unchanging as the exposure dose and the reticle image size are changed. This allows very precise image control for the space width within each chip, across each wafer, and from one batch of product wafers to the next.

Still another advantage the hybrid resist is the relaxation of the minimum reticle feature size due to the frequency doubling capability of hybrid resist. For example, to print a 0.2 $\mu$m feature with conventional resist generally requires a 0.2 $\mu$m reticle image size. With hybrid resist, a 0.2 $\mu$m space can be formed with a single edge of a reticle feature; for example, a 0.5 $\mu$m reticle opening could produce two 0.2 $\mu$m spaces and a 0.2 $\mu$m line. In this way, one could accomplish "reduction" x-ray or E-beam lithography; the reticle image pitch could be approximately 2× the printed pitch on the substrate. This also has the additional advantage of allowing a relaxation of the image size requirements of optical reticles, reducing cost and improving yield of the reticle. It is an advantage of hybrid resist that lines and spaces of 0.2 $\mu$m and less may be achieved without altering the present optical lithography tools.

It is a further advantage that the space width is generally unchanging as the exposure dose and reticle sizes change, thereby allowing greater process latitude for control of space width. Through the use of the hybrid resist of the present invention, errors in the image dimension on the reticle are not reproduced in the space width printed on the substrate. As a result, the across-chip space width variation is minimized. This is valuable for optical, X-ray and e-beam exposure methods. It is especially useful in lithographic techniques that require a 1× reticle, i.e., a reticle that normally has a one-to-one relationship with the image printed on the substrate, because variations in the image size on the reticle are normally reproduced on the substrate.

Figure 2:
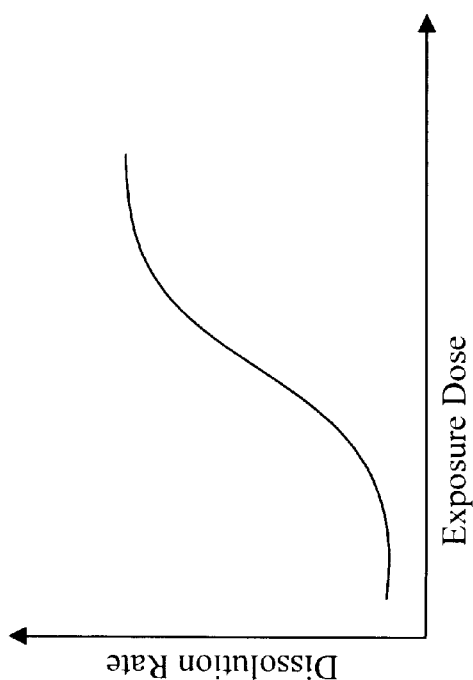
FIG. 2 is a graph is illustrating how positive resist undergoes an increase in solubility as the exposure dose is increased.

Accordingly, the preferred embodiment hybrid resist provides a photoresist material having, simultaneously, both a positive tone and a negative tone response to exposure. The positive tone response dominates at the lower exposure dose while the negative response predominates at the higher exposure dosages. Exposure of this resist creates a space/line/space combination, whereas either of the conventional resists would produce only a single feature. Turning to FIG. 2, a graph is illustrated showing how positive resist undergoes an increase in solubility as the exposure dose is increased. Turning to FIG. 3, the line pattern for positive resist printed with a reticle line pattern is illustrated.

Figure 5:
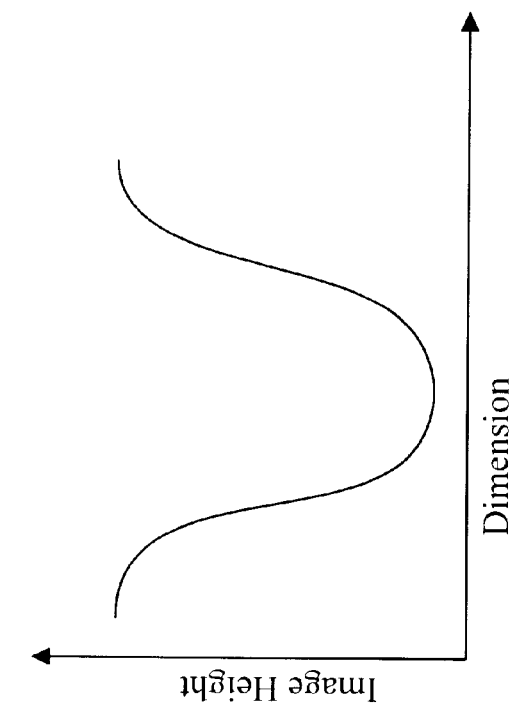
FIG. 5 is a graph illustrating the line pattern for negative resist printed with a reticle line pattern.
Figure 4:
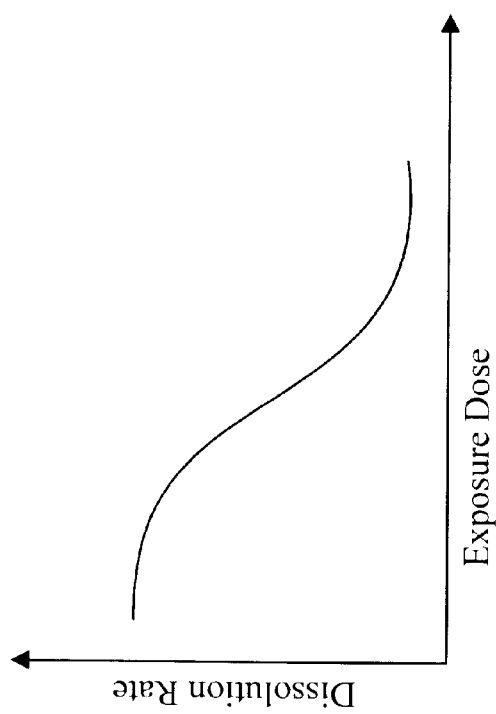
FIG. 4 is a graph illustrating how in negative resist systems exposed areas undergo a reduction in solubility as the exposure dose is increased.

On the other hand, in the negative resist system exposed areas undergo a reduction in solubility as the exposure dose is increased, as illustrated in FIG. 4. Turning to FIG. 5, the line pattern for negative resist printed with a reticle line pattern is illustrated.

Figure 7:
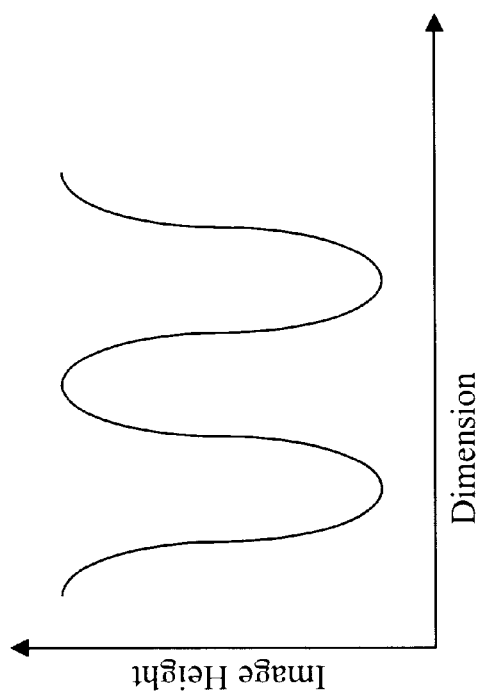
FIG. 7 is a graph illustrating the space/line/space pattern formed onto a substrate using hybrid resist.
Figure 6:
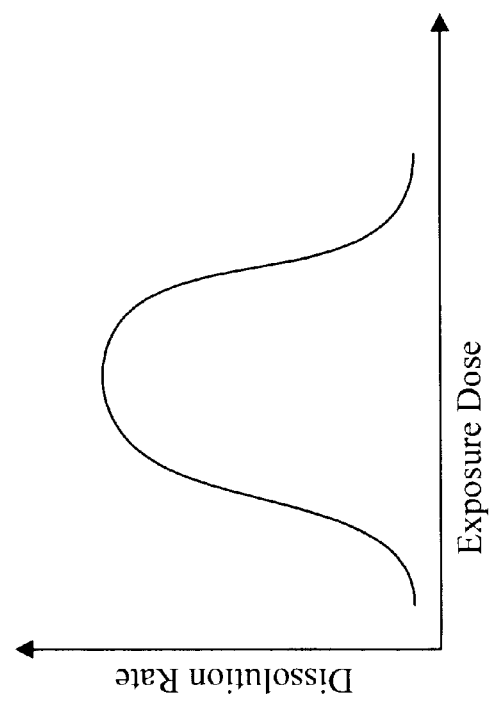
FIG. 6 is a graph of the resist solubility as a function of exposure dose for hybrid resist.

For the hybrid resist of the present invention, the positive tone response causes an increase in solubility in the areas where diffraction effects have reduced the exposure intensity, such as the areas near the edge of the reticle image. As the exposure dose is increased, the negative tone response predominates, causing a reduction in solubility in the more highly exposed areas. Turning to FIG. 6, the graph of the resist solubility as a function of exposure dose for hybrid resist is illustrated. Printing a reticle line pattern onto a substrate results in the space/line/space pattern illustrated in FIG. 7.

In this manner, the aerial image is "frequency doubled" to produce twice the number of features than would otherwise be attainable with the standard resist. FIG. 1 illustrates these salient differences between a positive resist, a negative resist, and a hybrid resist. In FIG. 1, a photoresist 140 has been deposited over the surface of substrate 150. A mask 120 with chrome areas 130 is used to selectively mask portions of photoresist 140 from an optical radiation source. After exposure, photoresist 140 is developed and portions subsequently removed by washing the surface of the wafer. Depending on the nature and composition of photoresist 140, a certain pattern, which is related to chrome areas 130 on mask 120, will be formed in photoresist 140. As shown in FIG. 1, a positive photoresist will leave areas that correspond to chrome areas 130. A negative photoresist will create a pattern whereby the areas that correspond to chrome areas 130 are removed from substrate 150. A hybrid photoresist material will leave a photoresist pattern that corresponds to removal of the photoresist material from the areas of substrate 150 that are associated with the edges of chrome areas 130.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

The resist formulations may be varied to obtain a fast positive tone reaction and a slow negative tone reaction for optimal results. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results.

Figure 10:
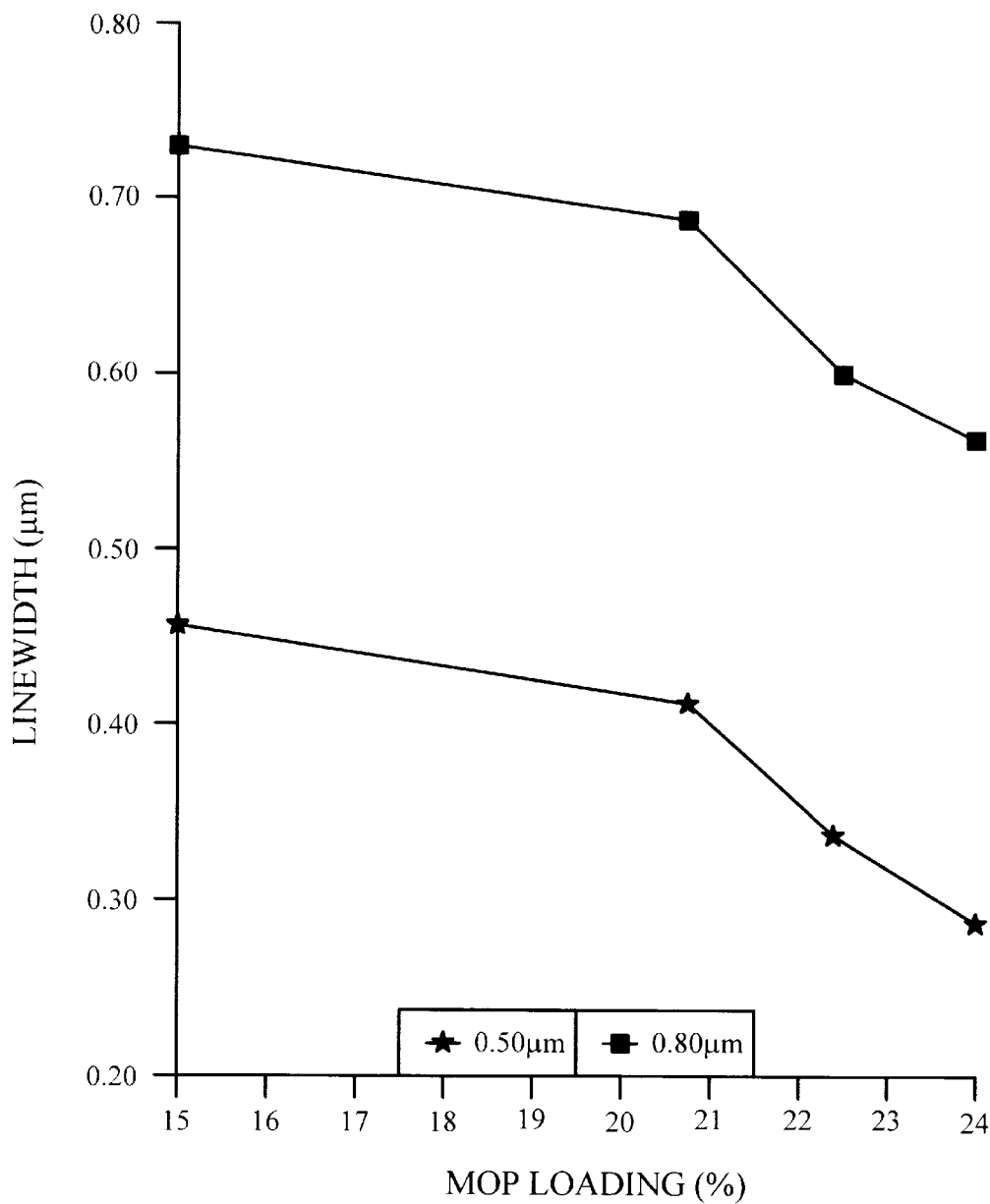
FIG. 10 is a graph showing the line width in nm plotted against the amount of positive tone solubility inhibitor (MOP) incorporated in a hybrid resist of the present invention.
Figure 15:
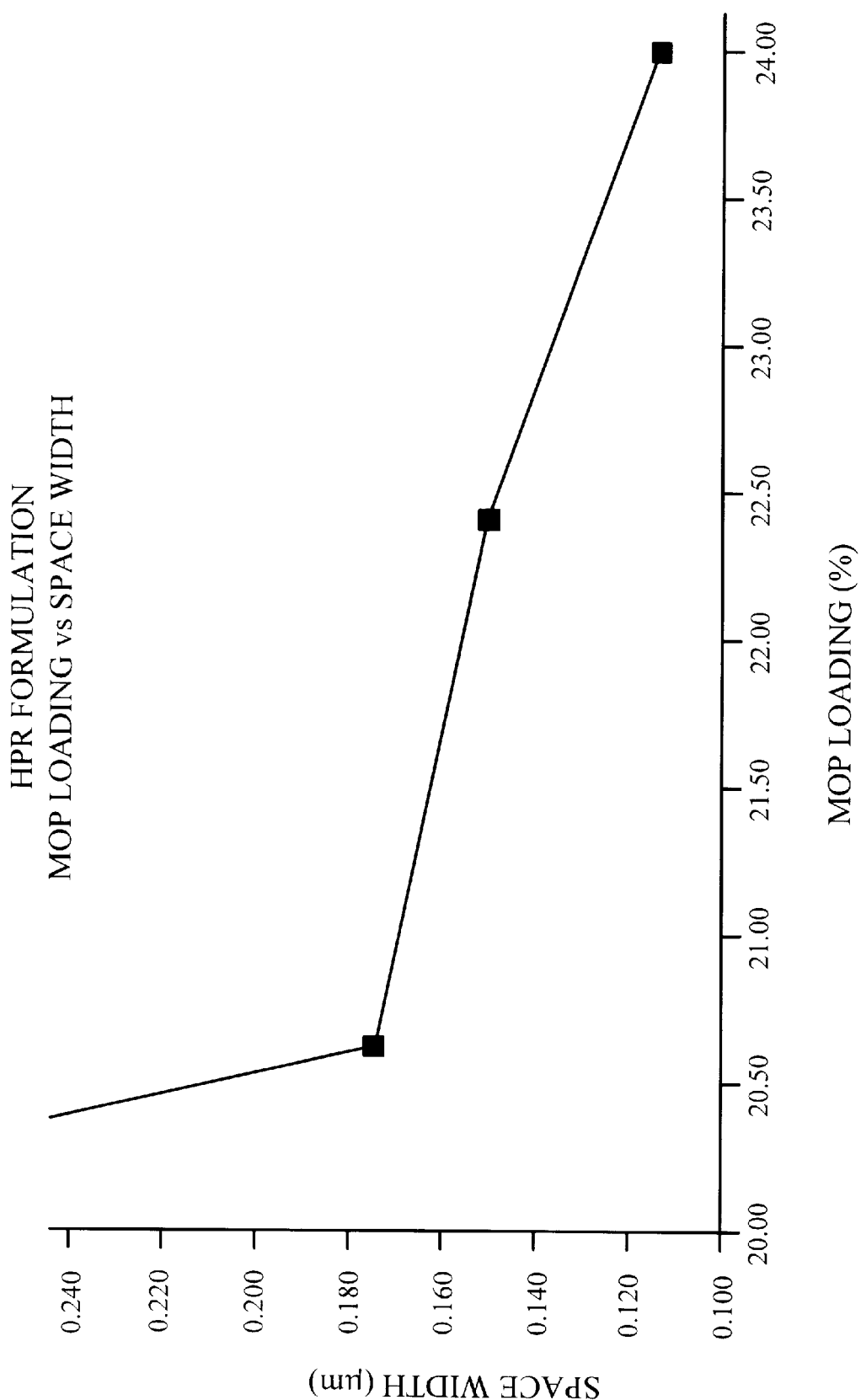
FIG. 15 is a graph showing the variation in space width in $\mu$m as a function of MOP loading using one formulation of hybrid resist of the present invention.

In addition, the resist formulations may be altered to provide space widths of different dimensions. For example, as the amount of solubility inhibitor on the poly (hydroxystyrene) resin is increased, the printed space width becomes smaller (FIG. 15). This approach may also be used to alter the isofocal print bias of the negative tone line; at higher positive tone solubility inhibitor concentrations, the isofocal print bias of the negative tone line increases (FIG. 10). This is desirable in some applications for reducing the size of the printed negative tone line, optimizing the frequency doubling characteristics of the resist.

The relative responses of the positive and negative tone functions of the hybrid resist can also be altered by modifying the exposure conditions. For example, the negative tone line of the hybrid resist does vary with exposure dose and reticle dimension, similar to the behavior of a conventional resist. Thus, as exposure dose is increased, for example, the negative tone line increases in width, and the spaces remain the same size, but the spaces are shifted to a new position on the substrate, since they lie adjacent to the negative line. Similarly, the positive tone lines alter in size as the exposure dose or reticle dimension are altered.

As another example, two reticles could be used to print two separate patterns in the resist. One reticle could be exposed with a high dose, causing the hybrid functions to be expressed in the resist. Another reticle could be exposed in the same resist film at a lower dose, causing only the positive tone function to be expressed in that portion of the resist. This effect could also be accomplished with a single expose process if, for example, the reticle contained a partial filter of the actinic radiation in the areas where a lower exposure dose was desired. This allows wider spaces to be printed at the same time as the narrower features, which is necessary in some device applications.

In a modification of this two-step imaging approach, a hybrid resist can be used to create a standard negative tone pattern. If the resist film is image-wise exposed with a standard negative tone reticle, baked to form the hybrid image, then blanket exposed with actinic radiation and developed without a second post-expose bake process, the result is a standard negative tone image. This approach may be desirable in some applications, such as the formation of gate conductor circuits, which require very small lines to be printed, but do not require a high density image pitch. As an alternative to this method, the resist may be blanket exposed to a low dose of actinic energy after the image-wise exposure and before the baking step. The desirability of the method would depend on whether a solubility inhibiting protective group is present on the resin and whether the positive tone response is temperature dependent.

Figure 8:
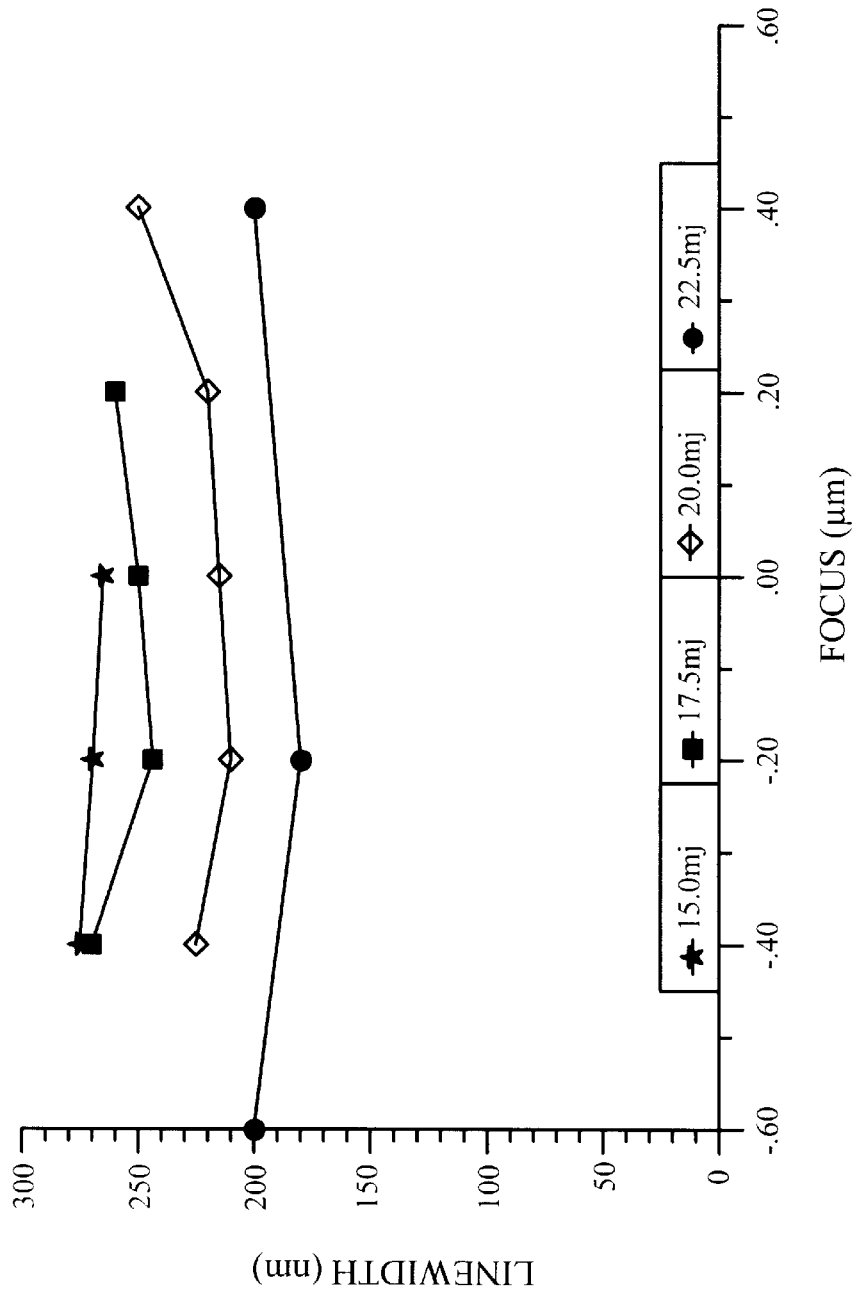
FIG. 8 is a graph of line width in nanometers (nm) plotted against focus in micrometers ($\mu$m) of a formulation of a standard negative resist at various exposure energies.
Figure 9:
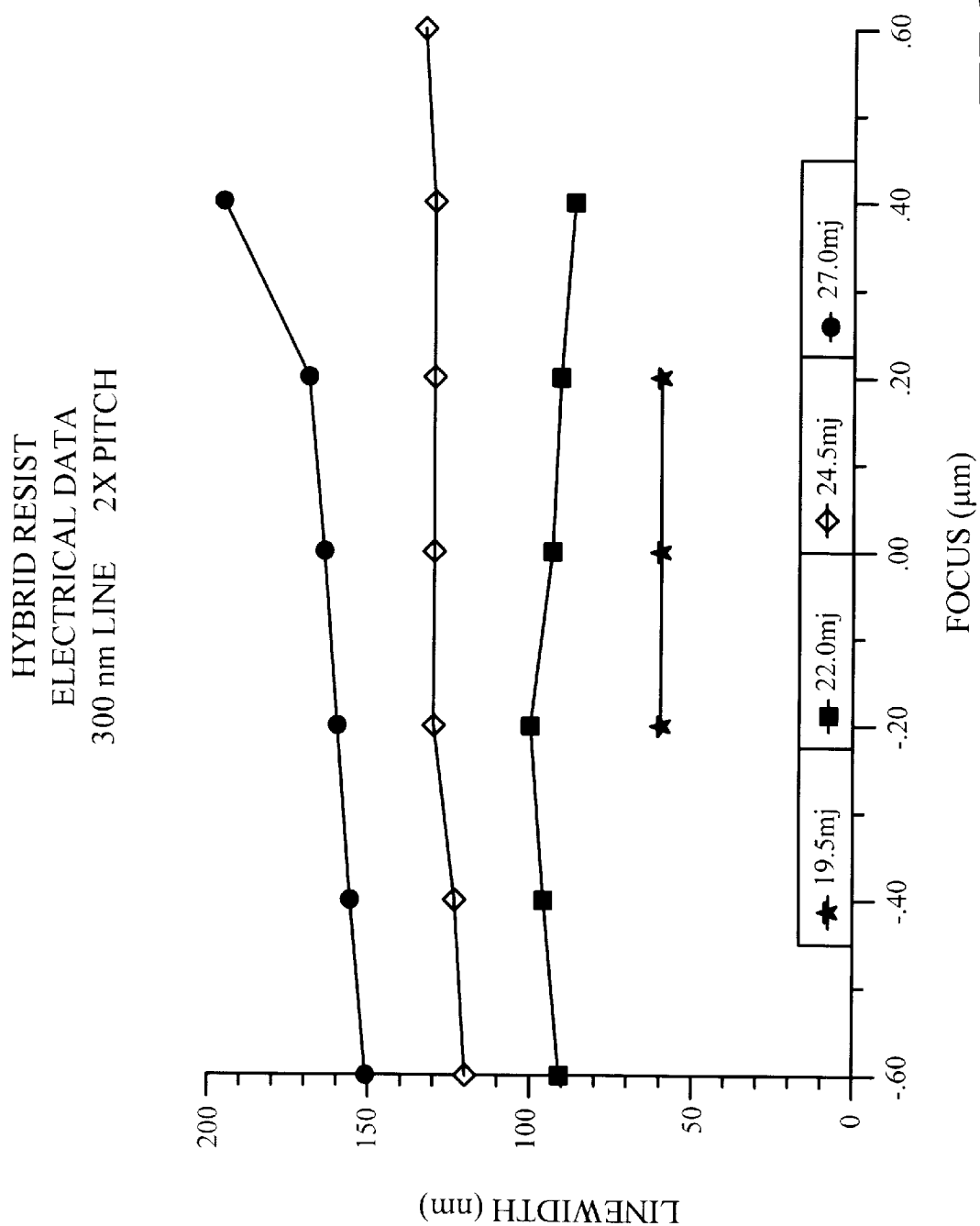
FIG. 9 is a graph of line width for a negative tone line of a hybrid pattern in nm plotted against focus in $\mu$m of a hybrid resist of the present invention at various exposure energies.

An advantage of using the hybrid resist in such applications is that the negative tone line of the hybrid resist can exhibit a large print bias at its isofocal point, as shown in FIG. 9. In other words, at the point of largest process latitude for the hybrid negative tone line, the resist image size can be substantially smaller than the reticle image size. This is desirable because the aerial image is less degraded by diffraction effects at the larger reticle size, thus allowing a larger depth of focus in optical lithography to be attained than is possible with conventional positive and negative tone systems, as shown in FIG. 8. This print bias is a result of the fact that the edge of the chrome line prints as a space. The space, in effect, acts to "trim" the edges of the aerial image, causing the negative line to print smaller than it would with a conventional negative resist. This is an expression of the frequency doubling character of a hybrid resist.

It is possible to design the resist formulation to optimize the print bias of the negative tone line. For example, by choosing an appropriate loading factor for the positive tone solubility inhibitor, one may obtain a particular print bias as shown in FIG. 10. In theory, it is quite obvious that similar variations in the photoresist response can also be brought about by making appropriate changes in concentrations and reactivities of other components as well.

Figure 11:
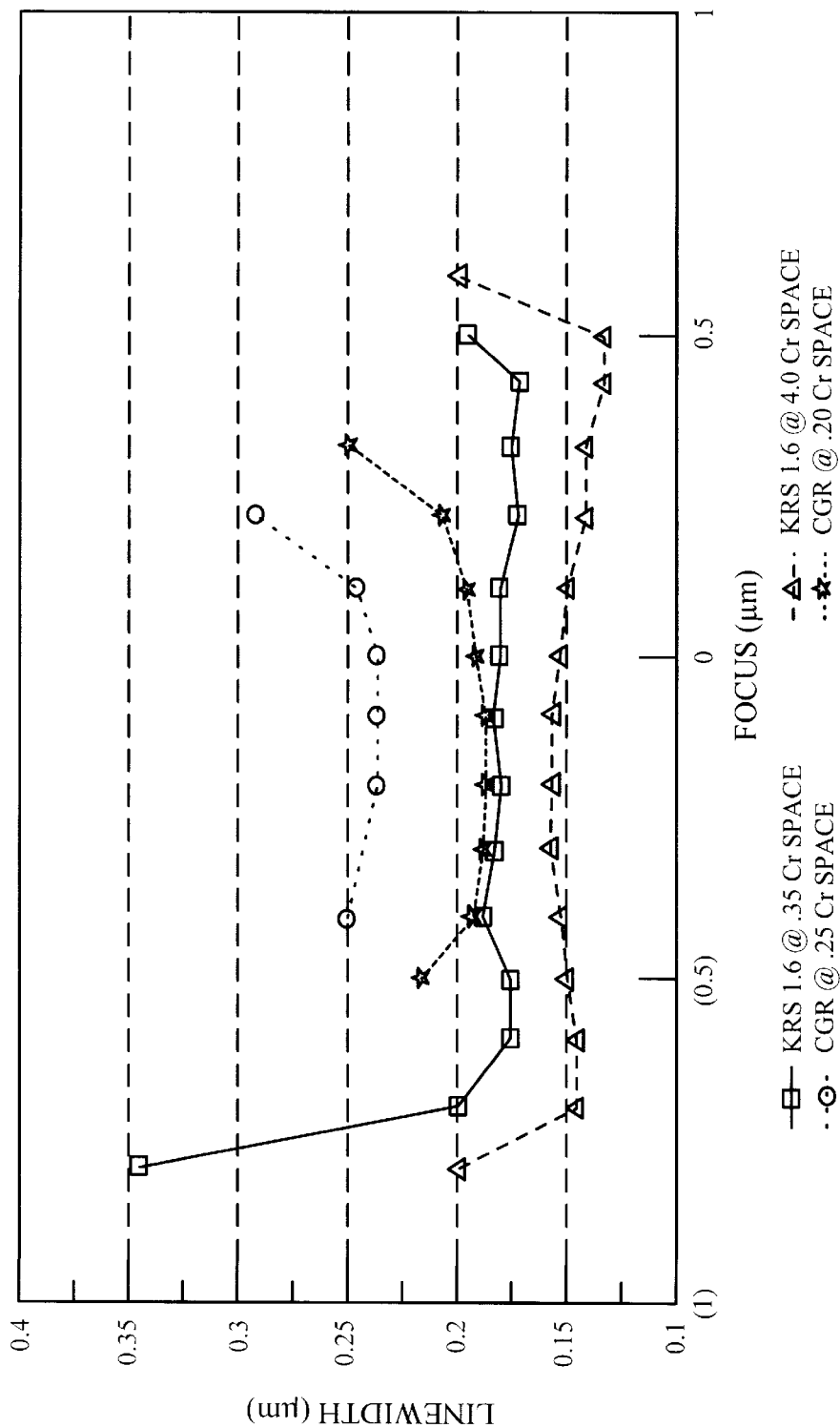
FIG. 11 is a comparative model of what the range of focus is for a given line width using standard resist formulations and a hybrid resist formulation of the present invention.

For example, we have found that with exposure on a DUV 0.5 NA lithography tool, the isofocal print bias for a hybrid resist can be 0.11 $\mu$m larger than the isofocal print bias for a standard negative tone resist, as exemplified in FIGS. 8 and 9 when standard calculations known in the art are performed on the data. This difference can be utilized in two ways. In one approach, the same reticle image size could be used with the hybrid resist to print a smaller line than the standard resist, while maintaining focus and exposure process latitude. In another manner of use, the size of the reticle features could be increased with the hybrid resist relative to the standard resist, while printing the same image size as the standard resist. The use of a larger reticle image provides a larger depth of focus due to reduced diffraction effects, as shown in the graph of FIG. 11. In the former application, higher performance is achieved with the smaller size of the hybrid resist. In the latter application, higher yield is achieved due to the larger process latitude of the hybrid resist.

The resist formulations may be varied to obtain a high photospeed positive tone reaction and a low photospeed negative tone reaction for optimal results. Additionally, the positive tone resist may be chosen so that it is insensitive to post expose bake (PEB) conditions so that the ratio of sensitivity of the positive tone to the negative tone function can be altered, thus changing the ratios of the space/line/space combinations.

Another option for changing the space/line/space ratios is to utilize a gray-scale filter in the reticle of the exposure tool. A gray scale filter only allows a portion of the radiation to pass through the reticle, thereby creating areas of intermediate exposure. This prevents the negative tone resist function from operating in these areas because the exposure dose would never reach the critical point, but would still allow the positive functions to occur, thereby creating wider spaces. This allows wider spaces to be printed at the same time as the narrower features, which is necessary in some device applications.

The following examples are exemplary of the frequency doubling resist composition, but are not meant to be limiting and many variations will be readily apparent to one of ordinary skill in the art.

The photoresist resins suitable for use in accordance with the invention include any of the base-soluble, long chain polymers suitable for use as a polymer resin in a photoresist formulation. Specific examples include: (i) aromatic polymers having an —OH group, e.g., polyhydroxystyrenes such as poly (4-hydroxystyrene), poly (3-hydroxystyrene), commercially available from Hoechst Celanese of Corpus Christi; Tex., novolak resins commercially available from Shipley of Marlboro, Mass.; and polymers having a phenolic —OH group, e.g., phenol formaldehyde resins; (ii) polymers having an acid group, e.g., polymethacrylic acid with an ester side chain; and (iii) acrylamide group type polymers.

The polymer resin in its deprotected form (i.e., once the positive tone reaction has occurred) is base soluble and compatible with developer solutions, such as aqueous solutions of metal-free ammonium hydroxide, tetramethylammonium hydroxide, and tetraethyl ammonium hydroxide, metal containing potassium hydroxide, and sodium metasilicate. Preferred polymer resins have an average molecular weight within the range of about 1,000 daltons to about 250,000 daltons, and most preferably within the range of about 1,000 to 25,000 daltons, to enhance its solubility in developer solutions. Examples include p-hydroxystyrene-maleic acid anhydride copolymers, polyhydroxystyrene-p-tertiarybutyl-carganatostyrene co-polymers, poly(2-hydroxystyrene), phenol-formaldehyde resins, polymethyl methacrylate-tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM-C, commercially available from Maruzen America of New York, N.Y. The PHM-C includes both poly (hydroxystyrene) subunits and vinyl cyclohexanol subunits preferably being in the range of about 99:1 to about 50:50. The most preferred ratio is about 90 poly (hydroxystyrene) units to about 10 vinyl cyclohexanol subunits.

Crosslinking compositions are preferably tetramethoxymethyl glycouril ("Powderlink") and 2,6-bis(hydroxymethyl)-p-cresol. However, other possible crosslinking compositions include:

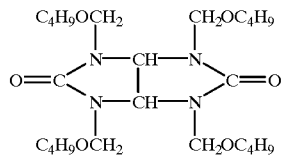

-continued

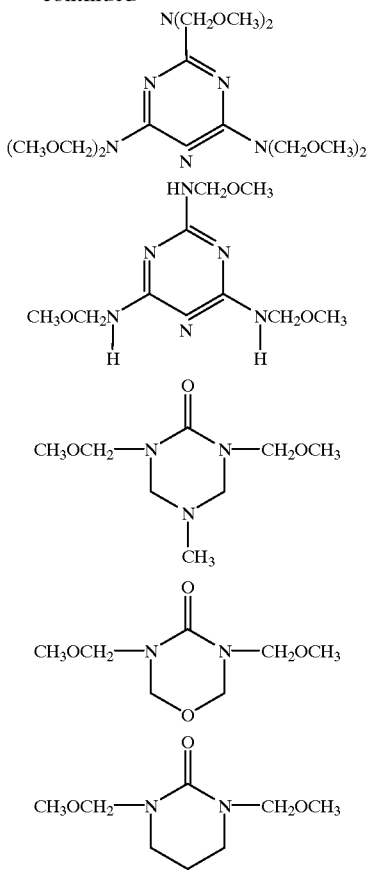

their analogs and derivatives, as can be found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycol-urils, for example of the formula:

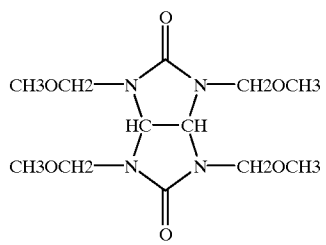

as can be found in Canadian Patent No. 1 204 547.

Photoacid generators ("PAGs") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxy-naphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

A casting solvent is used to provide proper consistency to the entire composition so that it may be applied to the substrate surface without the layer being too thick or too thin. Sample casting solvents include: ethoxyethylpropionate ("EEP"), a combination of EEP and -butyrolactone ("GBL"), and propylene-glycolmonomethylether acetate (PM acetate).

In the following Examples, one of each of these has been chosen, however, it is to be recognized that many other compositions may be selected for various portions of the resist. In the broadest sense, the method and structure of the preferred embodiment may be achieved using any hybrid resist comprised of a negative tone component and a positive tone component, wherein the positive tone component acts at a first actinic energy level and the negative tone component acts at a second actinic energy level, the first and second actinic energy levels being separated by an intermediate range of actinic energy levels.

EXAMPLE 1

The following compositions were dissolved in propyleneglycol monomethylether acetate (PM acetate) solvent available from Pacific Pac, Inc., Hollister, Calif. containing 350 ppm of FC-430, a non-ionic fluorinated alkyl ester surfactant available from 3M, St. Paul, Minn. for a total of 20% solids:

- poly(hydroxystyrene) (PHS), 10% hydrogenated, available from Maruzen America, New York, N.Y. with about 25% of the phenol groups protected with methoxypropene (MOP), 81.2% of solids;
- N-(trifluoromethylsulfonyloxy)-bicyclo-[2.2.1]-hept-5-ene-2,3-dicarboximide (MDT), available from Daychem Labs, Centerville, Ohio, 10.5% of solids;
- tetramethoxymethyl glycouril (Powderlink), available from Cytec, Danbury, Conn., 8.2% of solids; and
- 7-diethylamino-4-methyl coumarin dye (Coumarin 1), available from the Aldrich Chemical Company, 0.1% of solids.

The solution was filtered through a 0.2 $\mu$m filter. The solution was coated onto silicon wafers primed with hexamethyl- disilazane with a soft bake of 110 Celsius (° C.) resulting in films of about 0.8 $\mu$m thick as determined by a Nanospec reflectance spectrophotometer. The coated wafers were then exposed with deep ultraviolet (DUV) excimer laser radiation having a wavelength of 248 nm in a 0.37 numerical aperture (NA) Canon stepper with a matrix of different doses from low doses to high doses and post expose baked (PEB) at 110° C. for 90 sec. The dissolution rates of the exposed films were calculated from the thickness of remaining film after developing for a given amount of time with 0.14 Normal (N) tetramethylammonium hydroxide (TMAH) developer. The dissolution rate vs. exposure dose relationship is shown in FIG. 6. As shown in FIG. 6, the resist has a very low dissolution rate (about 2 nm/sec) when unexposed. As the dose is increased, the dissolution rate increases until reaching about 50 nm/sec. The dissolution rate remains relatively constant at this level in the dose range of about 1 milliJoule (mJ) to about 3 mJ. Increasing the dose further, the negative cross-linking chemistry becomes predominant and the dissolution rate falls back to a value close to zero.

Figure 13:
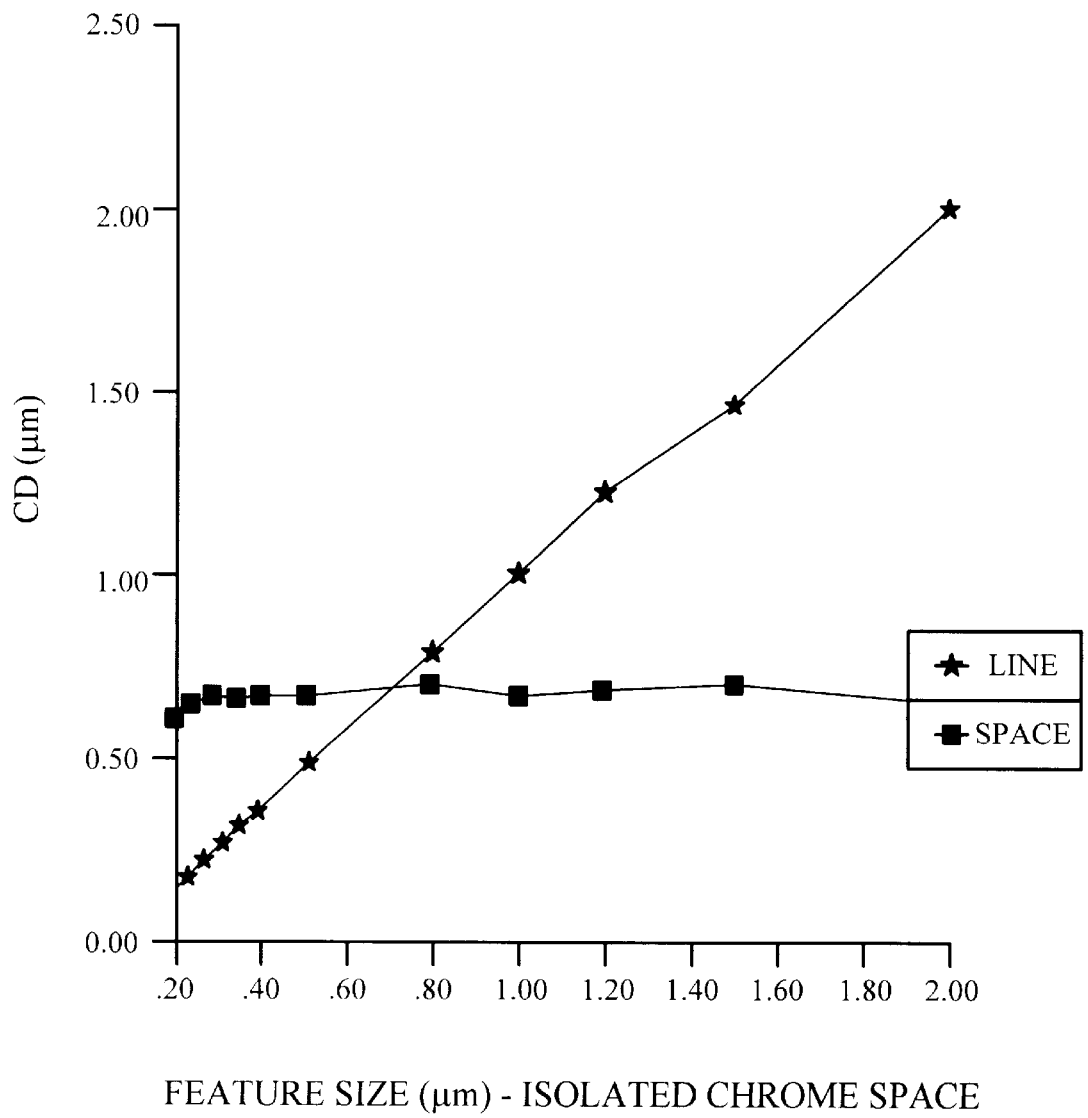
FIG. 13 is a graph showing the resultant line width and constant space width as functions of the chrome space width using one formulation of a hybrid resist of the present invention.

In another experiment with the same resist, when a MICRASCAN II 0. 5NA DUV stepper is used to expose an isolated chrome space onto the hybrid resist film, the space/line/space measurements as a function of width of the chrome space are plotted, as shown in FIG. 13. The data suggests that, although the width of the line increases correspondingly with that of the chrome space on the mask, the space on either side of the line remains relatively constant.

EXAMPLE 2

This example illustrates the manner in which changing the type of photoacid generator and relative amounts of the various components can change the dissolution rate characteristics of the hybrid resist and subsequently the lithographic response. This second formulation was prepared and processed in a manner similar to EXAMPLE 1, however, it is comprised of the following components:

- PHS with about 25% of the phenol groups protected with MOP, 90.8% of solids;
- triphenyl sulfonium triflate, 1.3% of solids;
- Powderlink, 7.8% of solids;
- tetrabutyl ammonium hydroxide base, 0.1% of solids; and
- sufficient PM acetate containing 350 ppm FC-430 surfactant as a solvent to form a 18.9% solids solution.

Figure 12:
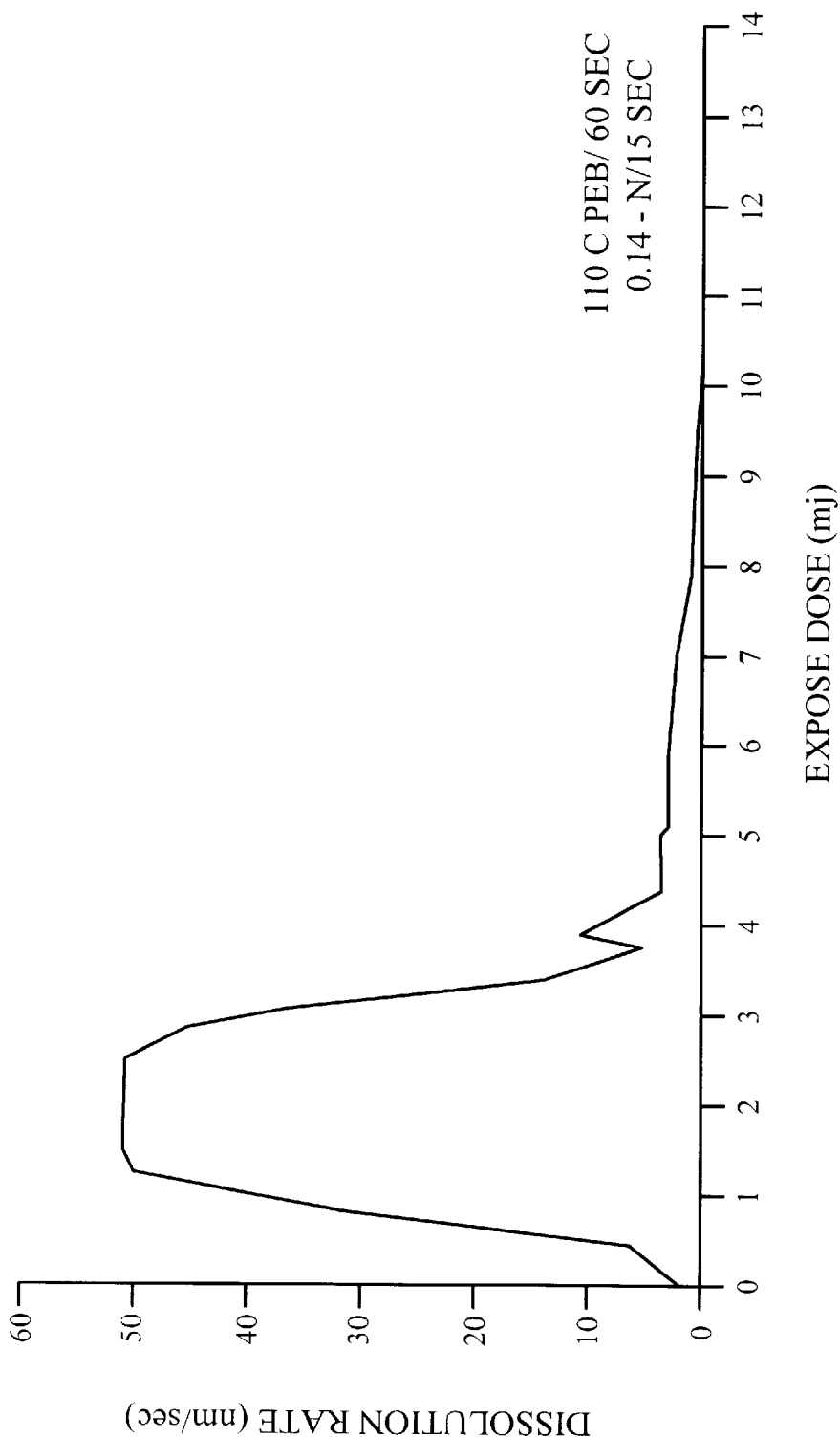
FIG. 12 is a graph showing the dissolution rate in nanometers per second (nm/sec) as a function of the exposure dose in millijoules (mJ) using one formulation of a hybrid resist of the present invention.
Figure 14:
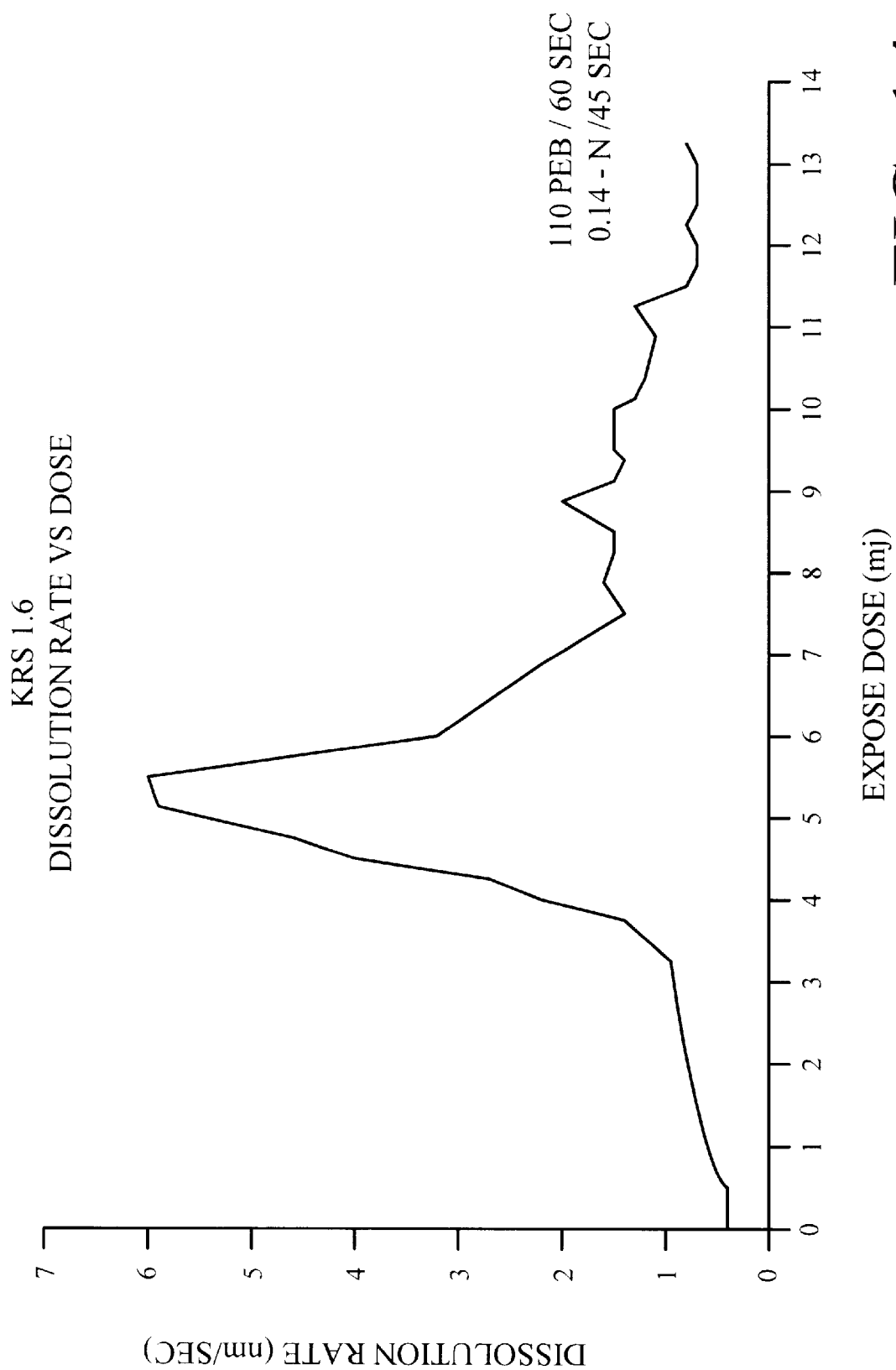
FIG. 14 is a graph showing the dissolution rate of an alternative formulation of the hybrid resist in nm/sec as a function of the exposure dose in mJ.

The dissolution rate characteristic of the resulting hybrid resist is shown in FIG. 14. The overall nature of the curve remains similar to that shown by the hybrid resist of EXAMPLE 1, in that the dissolution rate starts out low for an unexposed resist, increases to a high at about 5 mJ and decreases to a low above 7 mJ. However, the absolute dose range and the dissolution rates within these ranges are quite different from those shown in FIG. 12.

Figure 16:
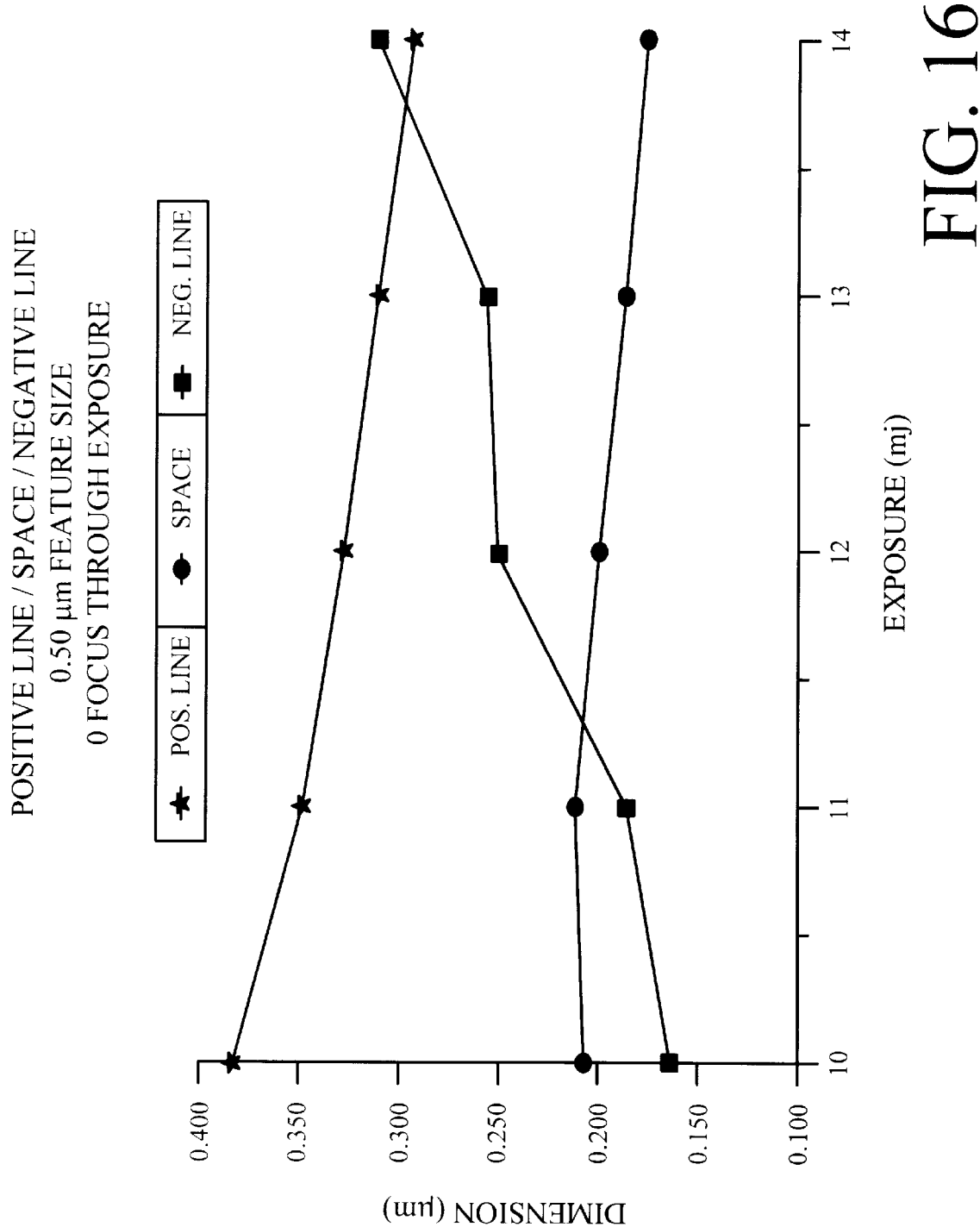
FIG. 16 is a graph of the response of a formulation of the hybrid resist of the present invention in which exposed (negative) line, unexposed (positive) line and space widths are plotted as a function of exposure dose.

FIG. 16 represents the response of this formulation of the hybrid resist when exposed through a mask of nested chrome lines and spaces of equal widths in a MICRASCAN II DUV 0.5 NA stepper tool. Negative line, unexposed (positive) line and space widths are plotted as a function of exposure dose. The space remains relatively constant in the range of about 0.18 $\mu$m, whereas both lines vary as the exposure dose is varied.

EXAMPLE 3

This example illustrates that the space width of the frequency doubled image can be changed by varying the protection level of PHS with MOP. Two different PHS lots having 24% and 15% MOP loading, respectively, were used to make hybrid formulations identical to that of EXAMPLE 1, except that the total solids contents were adjusted to 16.0% of the total to obtain film thicknesses of about 0.5 $\mu$m. From these two stock formulations, several other formulations with average MOP levels ranging from 15 to 24% were prepared. Wafers were coated and soft baked at 110° C., exposed on a MICRASCAN II DUV 0.5 NA stepper, post exposed baked at 110° C. for 60 sec and finally developed with 0.14N TMAH developer. A reticle with an isolated chrome opening was printed in a hybrid resist film. The space width of the resist image was measured and graphed as a function of the average MOP solubility inhibitor loading in the PHS used for making the respective formulations. It was found that the space width was strongly dependent on MOP concentration, as shown in FIG. 15.

EXAMPLE 4

Negative tone imaging may be performed with the hybrid resist of the present invention, using a blanket DUV expose after the PEB and prior to the develop.

A hybrid resist formulation as described in EXAMPLE 2, above, was image-wise exposed with a chrome reticle with an electrical test pattern on a 0.5NA DUV expose system. Silicon wafers (200 mm) with a 2000 Angstrom (Å) film of polysilicon were used as a substrate so that the resulting etched patterns of the resist image could be measured with electrical probe techniques. After the post expose bake process, the wafers were cycled back into the expose tool (MICRASCAN II) and exposed at 10 mJ per square centimeter ($cm^2$) with a clear glass reticle. A post expose bake process was not performed after the second exposure. The purpose of the second exposure was to remove the initially unexposed resist from the wafer, leaving only a negative tone resist pattern after develop.

The initial image-wise expose dose was 17–24 $mJ/cm^2$, the post expose bake temperature was 110° C. for 90 sec and the develop time was 100 sec in 0.14N TMAH. A standard negative tone resist was processed in a similar fashion, with the omission of a blanket expose step as a control. The electrical data from this experiment is shown in FIGS. 8 and 9. A large isofocal print bias of approximately 0.11 µm was observed for the hybrid resist relative to the standard negative resist, as calculated using standard methods known in the art.

Figure 19:
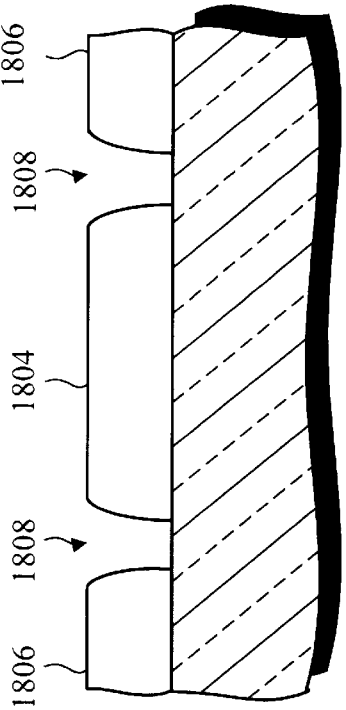
FIG. 19 is a cross-sectional side view of the wafer portion of FIG. 18 taken along line 19—19.
Figure 20:
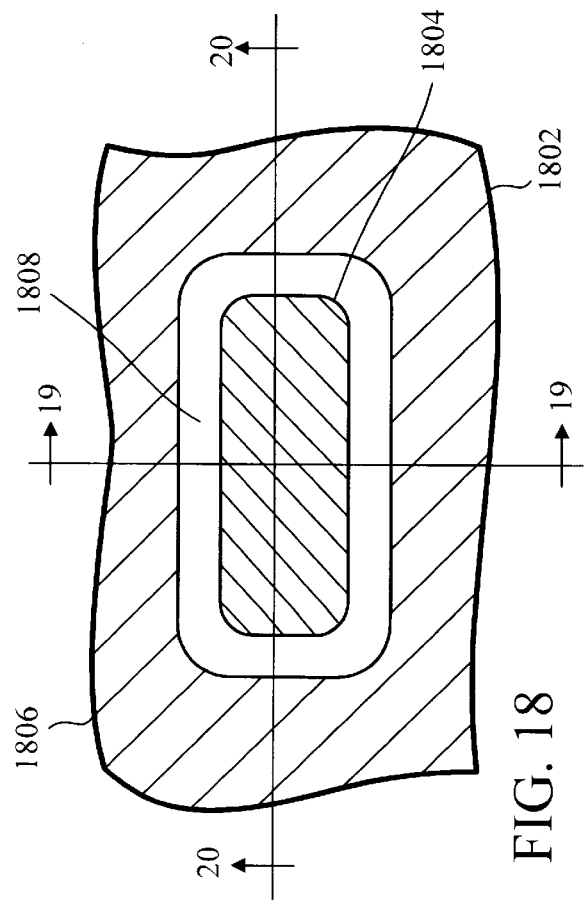
FIG. 20 is a cross-sectional side view of the wafer portion of FIG. 18 taken along line 20—20.
Figure 17:
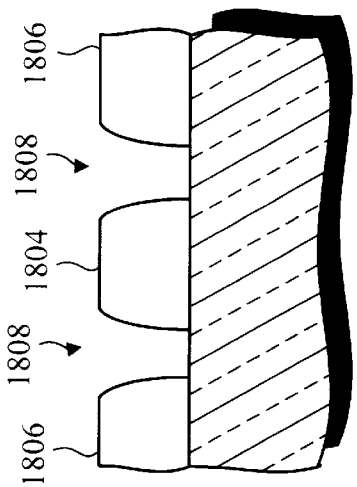
FIG. 17 is a schematic view of an exemplary mask portion.

When hybrid resist is exposed to actinic energy, areas of the resist which are subject to a full exposure form a negative tone line pattern, areas which are unexposed form a positive tone pattern, and areas which are exposed to intermediate amounts of radiation become soluble and wash away during development. Turning to FIG. 17, an exemplary mask 1700 containing a mask blocking shape 1702 is illustrated. When hybrid resist is deposited on a wafer, exposed through mask 1700 with actinic radiation, and developed, the mask 1700 creates the a "linked" or "donut" pattern in the hybrid resist. Such a linked pattern is illustrated FIGS. 18, 19 and 20, where FIG. 19 is a cross section of the wafer in FIG. 18 taken along lines 19—19, and FIG. 20 is a cross section of the wafer in FIG. 18 taken along lines 20—20.

Figure 18:
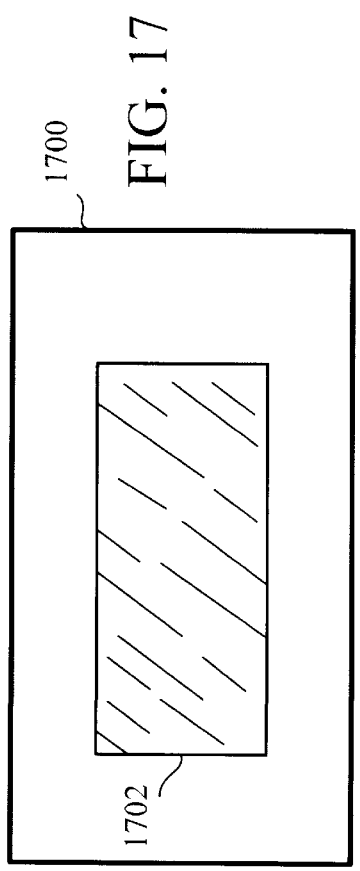
FIG. 18 is a top schematic view of a wafer portion with patterned hybrid resist upon it.

FIG. 18 shows a wafer portion 1802 upon which hybrid resist has been deposited, exposed through mask 1700 containing a blocking shape 1702 and developed. Hybrid resist portions which are unexposed (i.e., the inside region 1804 blocked by mask shape 1702) remain photoactive and insoluble in the developer and form positive tone line patterns. Hybrid resist portions which are exposed with high intensity radiation (i.e., the outside region 1806 not blocked by mask shape 1702 ) are completely cross-linked during the post exposure bake and form a negative tone line pattern. Hybrid resist portions which are exposed with intermediate amounts of intensity (i.e., the areas under the edges of mask shape 1702) become soluble in developer solution after the first exposure and are dissolved during the development step and form space 1808 in the hybrid resist.

Because portions of the hybrid resist were unexposed during the first exposure, these regions remain photoactive and now comprise positive tone resist patterns. Thus, by blanket exposing the wafer these positive tone resist patterns are polymerized and can be washed away during development. The blanket exposure is preferably an intermediate exposure, either by exposing at a low enough dose or for a short enough time to create an intermediate response to those areas of resist that were unexposed (i.e, the positive tone patterns) in the first exposure step.

In the alternative, the positive tone portions can be removed by a selective etch using a solution of pure n-butyl acetate at room temperature or with a strong base, such as 0.35 Normal ("N") tetramethyl ammonium hydroxide ("TMAH").

Figure 22:
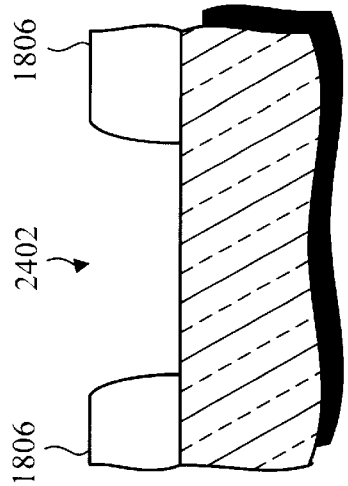
FIG. 22 is a cross-sectional side view of the wafer portion of FIG. 21 taken along line 22—22.
Figure 23:
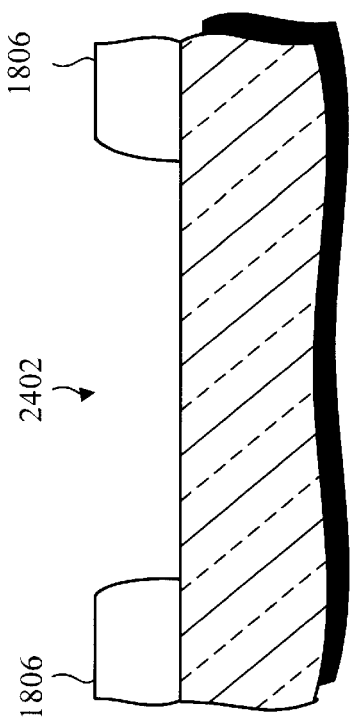
FIG. 23 is a cross-sectional side view of the wafer portion of FIG. 21 taken along line 23—23.
Figure 21:
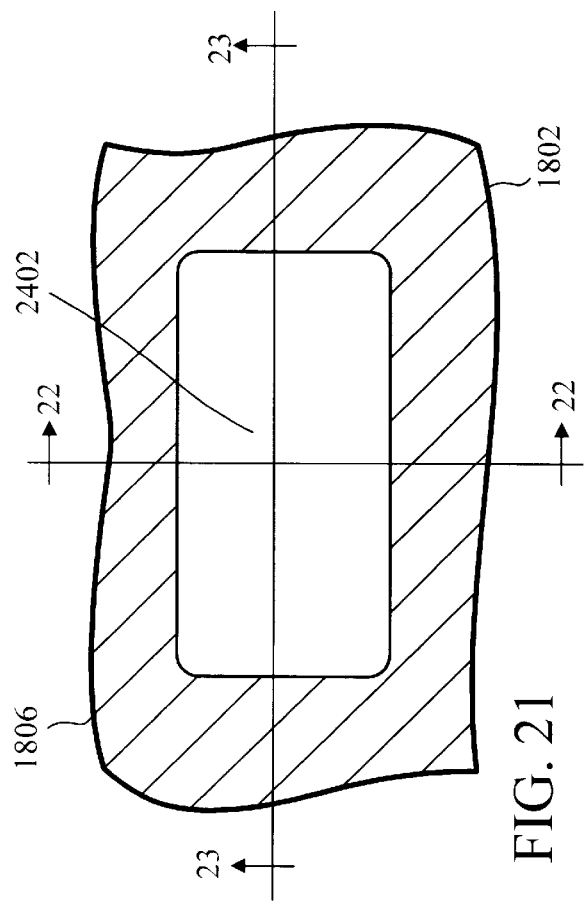
FIG. 21 is a top schematic view of a wafer portion with patterned hybrid resist and positive tone portions removed.

Turning to FIGS. 21, 22, and 23, the wafer portion 1802 is illustrated after a blanket exposure and development, where FIG. 22 is a cross section of the wafer portion in FIG. 21 taken along lines 22—22, and FIG. 23 is a cross section of the wafer taken along lines 23—23.

The blanket exposure has caused the positive tone regions (i.e., the hybrid resist portion 1804 (of FIGS. 18, 19 and 20)) which were unexposed (i.e., blocked by mask shape 1702) to become soluble and wash away during development.

PREFERRED EMBODIMENTS

Figure 24:
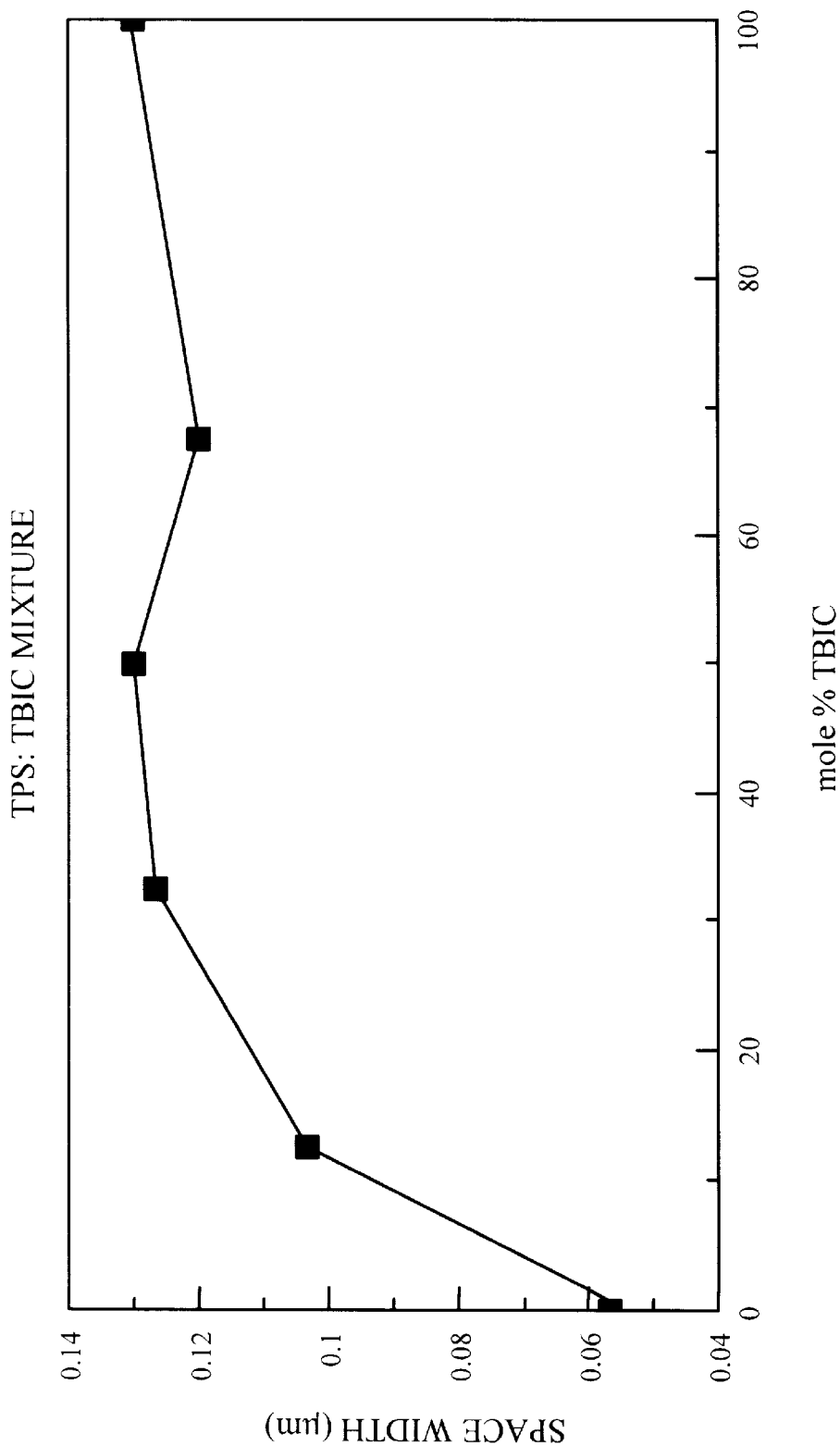
FIG. 24 is a plot of the change in hybrid resist space width for two photoacid generators and combination thereof.

The preferred embodiments of the present invention capitalize on the differing properties of PAGs to optimize the use of hybrid resist. In particular, the invention provides a means to vary the width of a hybrid space in a hybrid resist. That is, space width may be varied along a continuum of space widths while still providing increased device density, low across chip line width variation (ACLV), and independence from exposure dose and reticle image size control. It has been observed that at least some of the PAGs that may be used in a hybrid resist produce different space widths when used in resists exposed and developed under similar conditions. For example, as shown in FIG. 24, a hybrid resist containing only triphenylsulfonium triflate (TPS) as a PAG produced a space width of approximately 0.057 micrometer (µm). The hybrid resist contained polyhydroxystyrene (PHS) having 24% of its phenol groups protected by methoxycyclohexene (MOCH), received an exposure dose of 20 millijoule (mJ) of deep ultraviolet (DUV) irradiation (248 nm) through a 0.5 µm reticle opening, and was developed for 75 seconds (sec) in 0.14 Normal (N) tetramethylammonium hydroxide (TMAH). Also as shown in FIG. 24, a similarly formulated, exposed, and developed hybrid resist containing only di(p-t-butylphenyl)iodonium camphorsulfonate (TBIC) as a PAG produced a space width of approximately 0.13 µm. It was also observed that a 1:1 mole ratio mixture of the two PAGs (50 mole % TBIC) was used in a similarly formulated, exposed and developed hybrid resist and also produced a space width of approximately 0.13 µm.

According to a preferred embodiment of the present invention, the two PAGs of FIG. 24, or two or more other PAGs in keeping with the limitations described herein, may be combined in a photoresist to produce varying space widths. For example, if the two PAGs of FIG. 24 are combined at a mole ratio of 7:1 TPS to TBIC (12.5 mole % TBIC), then such a hybrid resist will produce a space width of approximately 0.105 µm. Although the reason for the observations described above is not completely understood, the strength of the acid produced by a given PAG is believed to be a significant factor in producing a given space width in a hybrid resist. For example, triflic acid, produced by TPS, is estimated to have an acid dissociation constant ($K_a$) of greater than about $1 \times 10^{12}$ while camphorsulfonic acid is estimated to have a $K_a$ of between about $1 \times 10^6$ to $1 \times 10^8$, yielding a difference of at least four orders of magnitude. Thus, TPS produces a stronger acid and yields the narrower space while TBIC produces a weaker acid and yields the wider space. One possible mechanism to explain this observation follows below.

As discussed in the preceding section, a space formed in a hybrid resist corresponds to the transition from light to dark at the edge of an aerial image. That is, the portion of a resist exposed to some predetermined range of intermediate radiation intensity (less than full intensity but more than zero intensity) will develop away to become a space. Since a hybrid resist contains components that make it initially aqueous base insoluble, the unexposed portion of a resist does not dissolve in aqueous base developer, such as TMAH, and instead remains as a positive tone line. Even though hybrid resist is initially aqueous base insoluble, it also contains components that allow the resist to cross link when exposed to actinic radiation. Accordingly, in areas exposed to fill intensity radiation, a PAG produces an acid that will catalyze both the deprotection chemistry and the crosslinking. In the deprotection chemistry, the acid typically cleaves acid-labile side chain groups of the polymer resin in the hybrid resist to convert a lipophilic resin to a hydrophilic resin, rendering it soluble in aqueous base developer. Despite the conversion to a hydrophilic resin, the crosslinking is also initiated by the acid catalyst in the same area exposed to full intensity radiation such that the exposed resist may be rendered insoluble in developer. Thus, exposed areas also remain, but as a crosslinked negative tone line. The deprotection chemistry that would normally render exposed areas soluble in developer occurred in the hybrid resist, but the crosslinking also occurred and will prevent dissolution of the negative tone line. In the portion of a hybrid resist exposed to some predetermined range of intermediate radiation intensity, a PAG will still produce some acid, although not as much since the radiation intensity is less. Essentially, the lesser amount of acid produced is sufficient to deprotect the lipophilic resin, rendering it soluble in developer, but is not sufficient to crosslink the hybrid resist to the extent that a negative tone line is formed. Instead, a hybrid space is formed when the resist is developed and the portion exposed to intermediate radiation intensity is thus removed.

It is preferred that the deprotection chemisty have a sufficiently low activation energy such that it will occur at room temperature (about 20 to 30 Celsius (° C.)). Such a low activation energy may be provided by selecting proper acid labile groups to protect the resin, such as acetals, ketals, or silyl ethers. If the deprotection has too high of an activation energy, as with ester and carbonate protecting groups, then the deprotection will not occur prior to baking. A post-expose bake is generally performed, as discussed in the previous section, at about 110° C. to complete the crosslinking of the negative tone line after acid generation during radiation exposure. That is, the crosslinking reaction has a higher activation energy than the preferred deprotection at room temperature. If the deprotection reaction is not completed prior to the post-expose bake that completes crosslinking, then it is possible that no hybrid space will form in the resist. Accordingly, if deprotection will not occur at room temperature, but will occur at a temperature sufficiently less then the post-expose bake, then modifications to the baking process may be required. Although not preferred, it may be possible to complete a deprotection reaction by baking at a low temperature for deprotection first and then stepping up to a higher temperature bake for crosslinking. If deprotection occurs at a temperature too close to the post expose bake, then formation of a hybrid space may be precluded absent some other way to make the deprotection chemistry work before completion of crosslinking. Preferably, at least a difference of approximately 10° C. exists between the deprotection temperature and the crosslinking temperature. For example, crosslinking completion in the post-expose bake discussed in the previous section will not occur appreciably below about 80° C. Thus, as long as deprotection is completed at approximately 70° C. or lower, the desired effect should be obtained.

Figure 25:
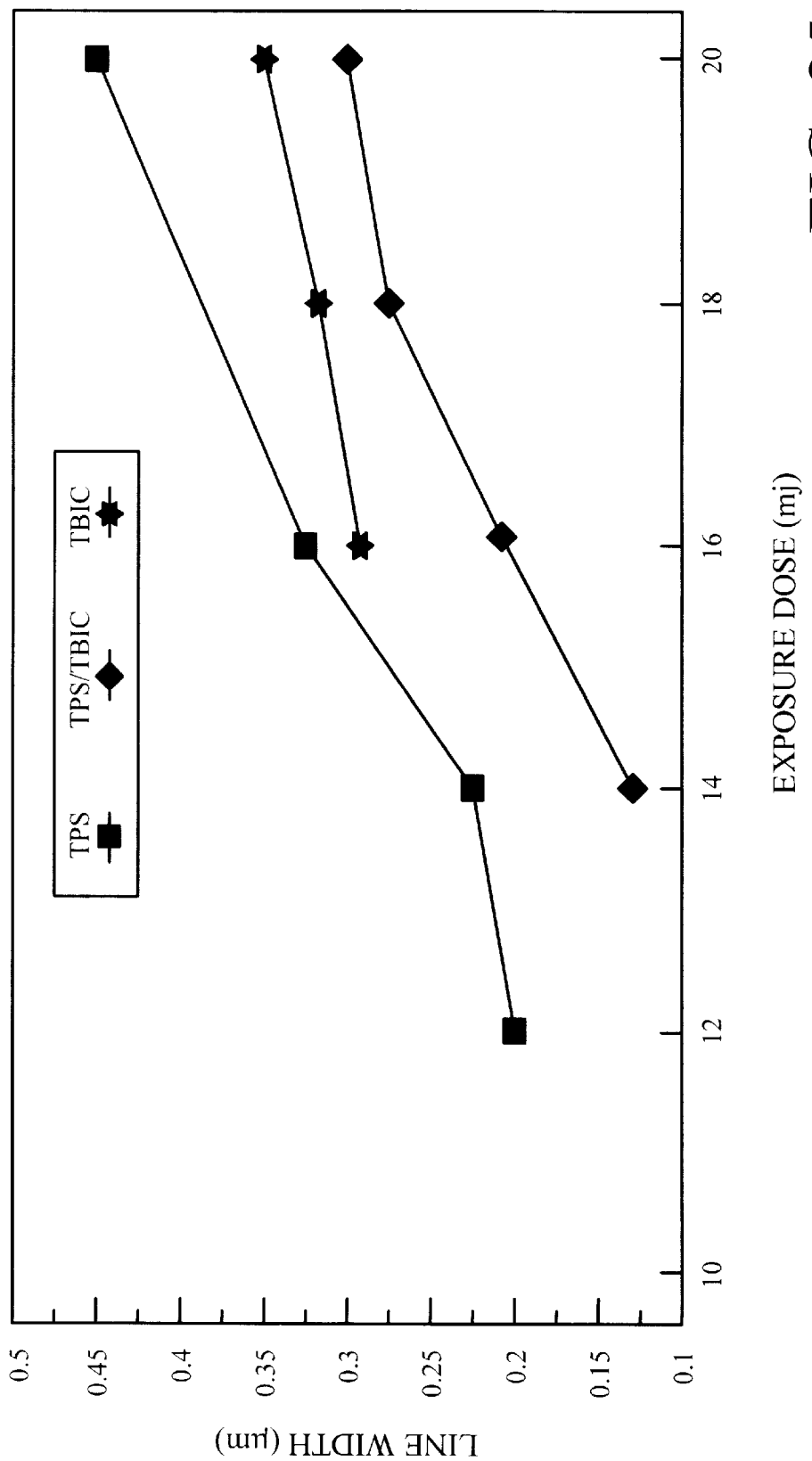
FIG. 25 is a plot of the change in hybrid resist negative line width with respect to expose dose for two photoacid generators and combination thereof.

Understanding the above discussion, it can be seen how a change in the crosslinking reaction or deprotection chemistry might affect the dimension of the hybrid space width. For example, it appears that the difference in the strength of the acids produced by TPS and TBIC is a significant factor in affecting the dimension of hybrid space width as shown in FIG. 24. Triflic acid produced by TPS is a stronger acid relative to camphorsulfonic acid, the weaker acid produced by TBIC. The two acids are essentially equally effective in the deprotection chemistry at cleaving the acid labile groups and converting exposed lipophilic resist to hydrophilic resist. However, the stronger triflic acid is more effective at catalyzing the crosslinking reaction than the weaker camphorsulfonic acid. Since the stronger triflic acid is a more effective crosslinking catalyst, some of the area that might otherwise be part of the hybrid space will nevertheless produce enough acid for crosslinking to occur. Thus, when the resist is developed the hybrid space width will be smaller and the negative tone line width will be larger in comparison to the space and line that would be produced with a weaker acid. Similarly, the weaker camphorsulfonic acid is a less effective crosslinking catalyst so some of the area that might otherwise be part of the negative tone line will not produce enough acid for crosslinking to occur. Thus, when the resist is developed the hybrid space width will be larger and the negative tone line width will be smaller in comparison to the space and line that would be produced with a stronger acid. FIG. 25 shows how TPS, producing the stronger triflic acid, will yield a comparatively wider negative tone line than TBIC, producing the weaker camphorsulfonic acid.

According to a preferred embodiment of the present invention, the two PAGs that produce the stronger and weaker acids may be combined to vary the size of the hybrid space width. The combination of the two PAGs may be considered to change the effective acid strength of either of the individuals acids produced by the PAGS. In one sense, the stronger acid is diluted with the weaker acid to reduce crosslinking and increase space width yielded from the stronger acid. In another sense, the weaker acid is enhanced with the stronger acid to increase crosslinking and decrease space width yielded from the weaker acid. In either case, the PAG combination has an effective acid strength different from both the stronger acid and weaker acid alone. Preferably, the effective acid strength, or effective $K_a$, is greater than the $K_a$ of the weaker acid and less than the $K_a$ of the stronger acid. For the two particular acids discussed above, it should be noted that an equal molar parts combination of the respective PAGs does not produce a space width evenly between the space widths produced by the individual acids. Rather, a molar ratio of approximately 7:1 TPS to TBIC is required to produce a space width about even between the maximum and minimum.

Figure 26:
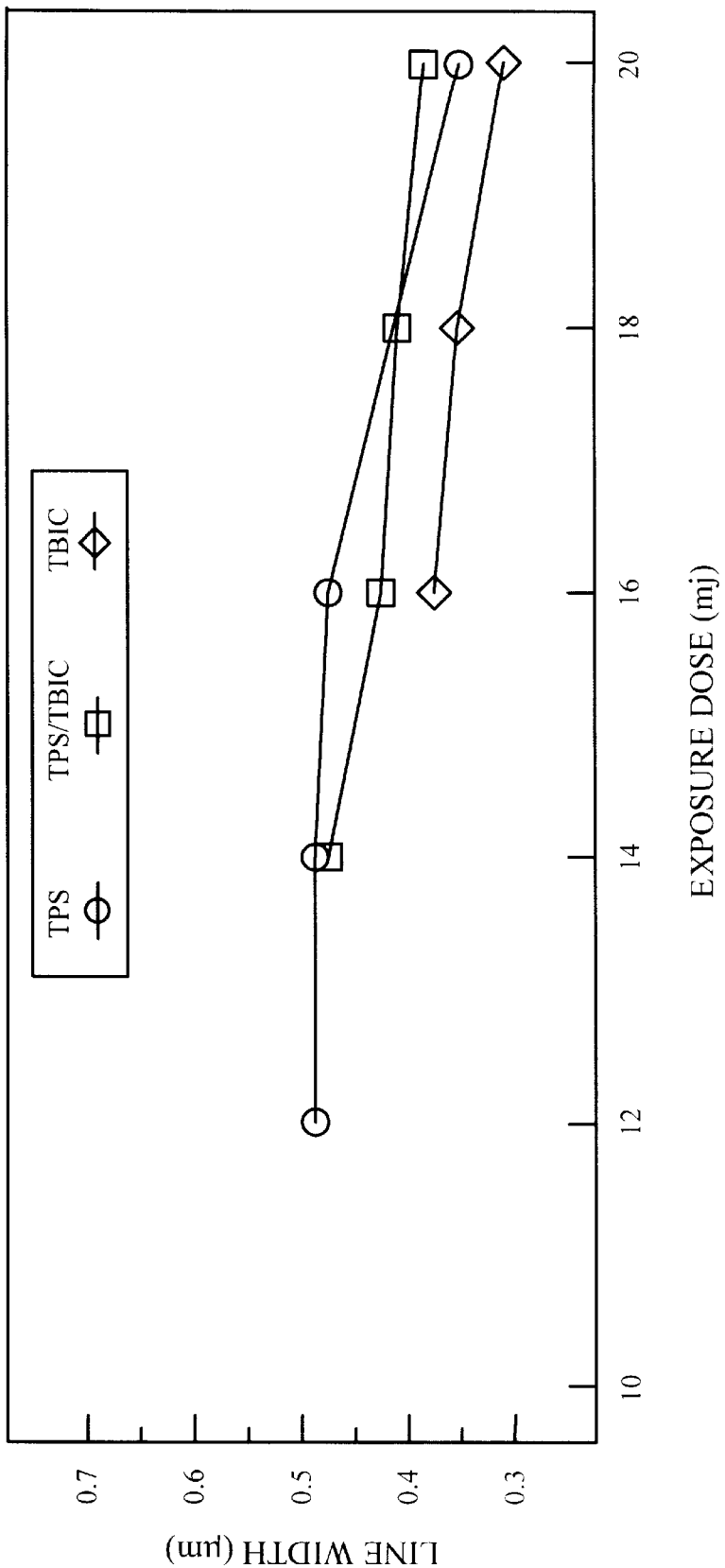
FIG. 26 is a plot of the change in hybrid resist positive line width with respect to expose dose for two photoacid generators and combination thereof.

Although the above discussion centers on the effect on crosslinking in the negative tone line, FIG. 26 also shows an effect on the dimension of the positive tone line when the two different PAGs are used. The impact on the size of positive tone line is less significant than the impact on the negative tone line, but it is worthy of mention. When the two PAGs are combined it can be seen in FIG. 26 that little change in positive tone line width occurs with respect to the positive tone line width produced by the stronger triflic acid.

It should be understood that the above discussion regarding stronger and weaker acids and the particular observations using TPS and TBIC represent only one preferred embodiment of the present invention. Many variations within the scope of the present invention are apparent given the above principles. In its basic form, the present invention simply provides using at least two photoacids in a hybrid photoresist to vary the hybrid space width. The two photoacids may be produced from two PAGs as discussed, or conceivably from only one PAG or even from more than two PAGs when at least two different PAGs produce the same photoacid. Similarly, the present invention also includes using more than two photoacids, wherein at least one is a weaker acid and at least one is a stronger acid. In any case, if the weaker/stronger acid distinction is relied upon, then it is preferred that there exists a difference of at least four orders of magnitude between the $K_a$ of the weaker and stronger acids, or more preferably a difference of five or more orders of magnitude. Also, the present invention includes relying on some characteristic of the acids other than acid strength to vary the space width when using at least two photoacids. That is, it is conceivable that the acid strengths of two acids might be equivalent and yet some other characteristic affecting the deprotection or crosslinking is relied upon to vary the hybrid space width. Further, the present invention includes using at least two photoacids to affect some aspect of the response mechanism in a hybrid resist other than that discussed by example above. For instance, perhaps the primary effect could be on the deprotection chemistry, rather than the crosslinking as discussed above, or both the deprotection and crosslinking could be significant in varying hybrid space width. Finally, it is even conceivable that the combination of at least two photoacids could produce a variation in space width that is not between the maximum and minimum set by the at least two photoacids, but perhaps less than the minimum or greater than the maximum. That is, some sort of synergistic effect might be obtained in combining photoacids to produce a space width that is less than the minimum that occurs with one photoacid alone or greater than the maximum that occurs with the other photoacid alone.

EXAMPLE 5

This example illustrates the manner in which blending different PAGs can be used to alter the hybrid space width. This formulation was prepared and processed in a manner similar to EXAMPLE 1 in the section above, however, it is comprised of the following components:

poly(hydroxystyrene) (PHS) with about 24% of the phenol groups protected with MOCH 90.04 weight % (wt%) of solids;

TPS, 2.19 wt % of solids;

TBIC, 0.31 wt % of solids;

tetrakis-n-butylammonium hydroxide, 0.25 wt % of solids;

Powderlink, 7.21 wt % of solids; and sufficient PM acetate containing 350 ppm FC-430 surfactant as a solvent to form a 15 wt % solids solution.

The characteristic hybrid space width obtained from this formulation is shown graphically in FIG. 24 at 12.5 mole % TBIC as 0.105 µm, along with similar data from similar formulations.

A preferred embodiment of the present invention also provides a method for optimizing space width in a hybrid photo resist. Such method includes the steps of: 1) selecting a desired space width; 2) selecting at least one PAG, wherein at least two photoacids will be produced upon exposure to actinic energy in relative proportions sufficient to produce the desired space width; and 3) forming a hybrid photo resist composition comprising the at least one PAG. Preferably, the step of selecting at least one PAG involves the steps of: a) determining the space width produced alone by each photoacid in a group of candidate photoacids; b) selecting at least two photoacids from the group of candidate photoacids such that at least one photoacid produces alone a space width greater than the desired space width and at least one other photoacid produces alone a space width less than the desired space width; c) determining the relative proportions of the at least two photoacids that will produce the desired space width; and d) determining at least one PAG that will produce the at least two photoacids in the relative proportions required. As discussed above, it is not necessarily required that the combined photoacids produce a space width between a maximum and a minimum set by the at least two photoacid alone. Instead, the space width produced by the combined photoacids may alternatively be either less than the minimum or greater than the maximum. Accordingly, the step of the described method could be modified to account for such a circumstance and still produce the desired space width. The steps of the described method are preferably conducted in keeping with the principles described above relating to effectiveness of the at least two photoacids at catalyzing the response mechanism in a hybrid resist. For example, it is preferred that a weaker/stronger acid distinction is relied upon to affect the crosslinking of the negative tone line, thus varying the hybrid space width. Nevertheless, a method within the scope of the present invention may rely upon other photoacid characteristics, response mechanisms, etc. as mentioned above.

While the invention has been particularly shown and described with reference to preferred embodiments thereof, it will be understood by those skilled in the art that various changes in form and details may be made therein without departing from the spirit and scope of the invention. Accordingly, unless otherwise specified, any compounds indicated herein are given as an example of possible compounds and not as a limitation. Similarly, unless otherwise specified, any sequence of steps of the method indicated herein are given as an example of a possible sequence and not as a limitation.

What is claimed is:

1. A photo resist composition comprising at least one photoacid generator (PAG), wherein at least two photoacids are produced upon exposure of the photo resist to actinic energy, and wherein the photo resist composition further includes a negative tone component and a positive tone component and wherein the photo resist is capable of producing a hybrid response to a single exposure such that:

a first portion of the photo resist that is unexposed during the single exposure remains photoactive;

a second portion of the photo resist that is exposed with high intensity actinic energy during the single exposure becomes substantially photo-inactive; and a third portion of the photo resist that is exposed to intermediate intensity actinic energy in an amount between the amount of intensity exposing the first portion and the amount of intensity exposing the second portion becomes soluble in developer solution.

2. The photo resist composition of claim 1, wherein the at least two photoacids differ in their effectiveness at catalyzing at least one mechanism of the hybrid response.

3. The photo resist composition of claim 1, wherein at least one of the at least two photoacids is a weaker acid and at least one of the at least two photoacids is a stronger acid, wherein there exists a difference of at least four orders of magnitude between the acid dissociation constant ($K_a$) of the weaker acid and the stronger acid.

4. The photo resist composition of claim 1, wherein an image developed in the photo resist after exposure through a clear reticle opening is frequency doubled, producing a space/line/space combination.

5. The photo resist composition of claim 3, wherein there is a difference of at least five orders of magnitude between the acid dissociation constant ($K_a$) of the weaker acid and the stronger acid.

6. A photo resist composition of claim 3 comprising at least one photoacid generator (PAG), wherein at least two photoacids are produced upon exposure of the photo resist to actinic energy and wherein the photo resist is capable of producing a hybrid response wherein at least one of the at least two photoacids is a weaker acid and at least one of the at least two photoacids is a stronger acid, wherein there exists a difference of at least four orders of magnitude between the acid dissociation constant ($K_a$) of the weaker acid and the stronger acid and wherein the relative proportions of the weaker acid, stronger acid, and any other photoacid produced by the at least one PAG are selected to provide an effective $K_a$ between the $K_a$ of the weaker acid and the $K_a$ of the stronger acid.

7. The photo resist composition of claim 5, wherein the at least two photoacids comprise triflic acid and camphorsulfonic acid.

8. The photo resist composition of claim 7, wherein the at least one PAG comprises two PAGs, triphenylsulfonium triflate and di(p-t-butylphenyl)iodonium camphorsulfonate.

9. A method for optimizing space width in a hybrid photo resist comprising the steps of:
 selecting a desired space width;
 selecting at least one photoacid generator (PAG), wherein the at least one PAG produces at least two photoacids upon exposure to actinic energy of a hybrid photo resist containing the at least one PAG and wherein the relative proportions of the at least two photoacids will produce the desired space width in the hybrid photo resist; and
 forming a hybrid photo resist composition comprising the at least one PAG.

10. The method of claim 9, wherein the hybrid photo resist composition additionally comprises a negative tone component and a positive tone component, wherein the positive and negative tone components respond together to a single exposure to produce a hybrid response such that:
 a first portion of the photo resist that is unexposed during the single exposure remains photoactive;
 a second portion of the photo resist that is exposed with high intensity actinic energy during the single exposure becomes substantially photo-inactive; and
 a third portion of the photo resist that is exposed to intermediate intensity actinic energy in an amount between the amount of intensity exposing the first portion and the amount of intensity exposing the second portion becomes soluble in developer solution.

11. The method of claim 9, wherein the at least two photoacids differ in their effectiveness at catalyzing the hybrid response.

12. The method of claim 9, wherein the step of selecting at least one PAG comprises the following steps:
 determining the space width produced alone by each photoacid in a group of candidate photoacids;
 selecting at least two photoacids from the group of candidate photoacids such that at least one photoacid produces alone a space width greater than the desired space width and at least one other photoacid produces alone a space width less than the desired space width;
 determining the relative proportions of the at least two photoacids that will produce the desired space width; and
 determining at least one PAG that will produce the at least two photoacids in the relative proportions.

13. The method of claim 9, wherein at least one of the at least two photoacids is a weaker acid and at least one of the at least two photoacids is a stronger acid, wherein there exists a difference of at least four orders of magnitude between the acid dissociation constant ($K_a$) of the weaker acid and the stronger acid.

14. The method of claim 10, wherein an image developed in the photo resist after exposure through a clear reticle opening is frequency doubled, producing a space/line/space combination.

15. The method of claim 12, wherein the at least one photoacid that produces alone a space width greater than the desired space width is a weaker acid, wherein the at least one other photoacid that produces alone a space width less than the desired space width is a stronger acid, and wherein there exists a difference of at least four orders of magnitude between the acid dissociation constant ($K_a$) of the weaker acid and the stronger acid.

16. The method of claim 13, wherein there is a difference of at least five orders of magnitude between the acid dissociation constant ($K_a$) of the weaker acid and the stronger acid.

17. The method of claim 13, wherein the step of selecting at least one PAG comprises selecting at least one PAG to produce relative proportions of the weaker acid, stronger acid, and any other photoacid produced by the at least one PAG to provide an effective $K_a$ between the $K_a$ of the weaker acid and the $K_a$ of the stronger acid.

18. The method of claim 16, wherein the at least two photoacids comprise triflic acid and camphorsulfonic acid.

19. The method of claim 18, wherein the at least one PAG comprises two PAGs, triphenylsulfonium triflate and di(p-t-butylphenyl)iodonium camphorsulfonate.

* * * * *